US010254653B2

United States Patent
Rostalski

(10) Patent No.: US 10,254,653 B2
(45) Date of Patent: Apr. 9, 2019

(54) IMAGING OPTICAL UNIT FOR IMAGING AN OBJECT FIELD INTO AN IMAGE FIELD, AND PROJECTION EXPOSURE APPARATUS INCLUDING SUCH AN IMAGING OPTICAL UNIT

(71) Applicant: Carl Zeiss SMT GmbH, Oberkochen (DE)

(72) Inventor: Hans-Juergen Rostalski, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/967,306

(22) Filed: Apr. 30, 2018

(65) Prior Publication Data

US 2018/0246410 A1 Aug. 30, 2018

Related U.S. Application Data

(63) Continuation of application No. PCT/EP2016/076700, filed on Nov. 4, 2016.

(30) Foreign Application Priority Data

Nov. 9, 2015 (DE) ........................ 10 2015 221 983

(51) Int. Cl.
*G03F 7/20* (2006.01)
*G02B 17/06* (2006.01)

(52) U.S. Cl.
CPC ....... *G03F 7/2008* (2013.01); *G02B 17/0647* (2013.01); *G02B 17/0652* (2013.01);
(Continued)

(58) Field of Classification Search
CPC ............ G03F 7/72008; G03F 7/72004; G03F 7/70233
(Continued)

(56) References Cited

U.S. PATENT DOCUMENTS

| 4,964,706 A | 10/1990 | Cook |
| 2007/0058269 A1 | 3/2007 | Mann et al. |

(Continued)

FOREIGN PATENT DOCUMENTS

| DE | 101 55 711 A | 5/2003 |
| DE | 10 2008 042 917 A1 | 4/2009 |

(Continued)

OTHER PUBLICATIONS

International Search Report for corresponding Appl No. PCT/EP2016/076700, dated Jan. 26, 2017.

(Continued)

*Primary Examiner* — Hung Nguyen
(74) *Attorney, Agent, or Firm* — Fish & Richardson P.C.

(57) ABSTRACT

An imaging optical unit for projection lithography has a plurality of mirrors for guiding imaging light from an object field in an object plane into an image field in an image plane along an imaging light beam path. At least two of the mirrors are embodied as GI mirrors. Exactly one stop serves to predefine at least one section of an outer marginal contour of a pupil of the imaging optical unit. The stop is arranged spatially in front of a penultimate mirror in the imaging light beam path. This results in an imaging optical unit that is well defined with regard to its pupil and is optimized for projection lithography.

21 Claims, 8 Drawing Sheets

(52) U.S. Cl.
CPC ....... *G02B 17/0657* (2013.01); *G03F 7/2004* (2013.01); *G03F 7/7025* (2013.01); *G03F 7/70233* (2013.01)

(58) Field of Classification Search
USPC ............................................... 355/53, 67–71
See application file for complete search history.

(56) References Cited

U.S. PATENT DOCUMENTS

| | | | |
|---|---|---|---|
| 2008/0170310 A1* | 7/2008 | Mann | G02B 17/0663 359/839 |
| 2016/0085061 A1* | 3/2016 | Schwab | G03F 7/70233 355/67 |

FOREIGN PATENT DOCUMENTS

| | | |
|---|---|---|
| DE | 10 2012 212 753 A1 | 1/2014 |
| DE | 10 2014 208 770 A1 | 1/2015 |
| DE | 10 2014 202 132 A1 | 7/2015 |
| DE | 10 2015 209 827 A1 | 9/2015 |
| WO | WO 2012/126867 A | 9/2012 |

OTHER PUBLICATIONS

German Examination Report, with translation thereof, for corresponding Appl No. 10 2015 221 983.6, dated Jun. 28, 2016.

* cited by examiner

IMAGING OPTICAL UNIT FOR IMAGING AN OBJECT FIELD INTO AN IMAGE FIELD, AND PROJECTION EXPOSURE APPARATUS INCLUDING SUCH AN IMAGING OPTICAL UNIT

CROSS-REFERENCE TO RELATED APPLICATIONS

The present application is a continuation of, and claims benefit under 35 USC 120 to, international application PCT/EP2016/076700, filed Nov. 4, 2016, which claims benefit under 35 USC 119 of German Application No. 10 2015 221 983.6, filed Nov. 9, 2015. The entire disclosure of these applications are incorporated by reference herein.

FIELD

The disclosure relates to an imaging optical unit for imaging an object field into an image field. Furthermore, the disclosure relates to an optical system including such an imaging optical unit, a projection exposure apparatus including such an optical system, a method for producing a micro- or nanostructured component via such a projection exposure apparatus, and a micro- or nanostructured component produced by the method.

BACKGROUND

Projection optical units are known from DE 10 2015 209 827 A1, DE 10 2012 212 753 A1, and U.S. Pat. No. 4,964,706.

SUMMARY

The present disclosure seeks to develop an imaging optical unit of the type mentioned in the introduction in such a way that an imaging optical unit that is well defined with regard to its pupil and is optimized for projection lithography results.

In one aspect, the disclosure provides an imaging optical unit for projection lithography. The imaging optical unit includes a plurality of mirrors for guiding imaging light from an object field in an object plane into an image field in an image plane along an imaging light beam path. At least two of the mirrors are embodied as GI mirrors. The imaging optical unit includes exactly one stop for predefining an entire outer marginal contour of a pupil of the imaging optical unit. The stop is arranged spatially in front of a penultimate mirror in the imaging light beam path. The object field is spanned by a first Cartesian object field coordinate and a second Cartesian object field coordinate. A third Cartesian normal coordinate is perpendicular to both object field coordinates. The imaging optical unit is embodied in such a way that the imaging light extends in a first imaging light plane, in which an imaging light main propagation direction lies. The imaging light extends in a second imaging light plane, in which the imaging light main propagation direction lies and which is perpendicular to the first imaging light plane. The number of first plane intermediate images of the imaging light which extends in the first imaging light plane and the number of second plane intermediate images of imaging light which extends in the second imaging light plane differ from one another.

According to the disclosure, it was recognized that an installation space in front of the penultimate mirror in the imaging light beam path is well suited for the arrangement of a stop since an imaging light beam then, as a rule, can be designed to be accessible from the outside from all sides. A GI mirror is a mirror with an angle of incidence of the imaging light that is greater than 60°. An NI mirror with an angle of incidence of the imaging light that is less than 45° is distinguished therefrom. The angle of incidence on the GI mirror can be greater than 65°, can be greater than 70°, can be greater than 75°, and can be greater than 80°. The stop predefines the entire outer marginal contour of the pupil of the imaging optical unit. The stop can be embodied in a plane fashion in sections. The stop can be configured with a 3D profile of a stop marginal contour. In addition to the stop predefining the outer marginal contour of the pupil, provision can be made of an obscuration stop for predefining an inner marginal contour of an obscuration of the pupil. In particular, it was recognized that the pupil of the imaging optical unit can also be predefined by exactly one stop in the case where a different number of first plane and second plane intermediate images is present.

In some embodiments, the last mirror in the imaging light beam path has a passage opening. Such a mirror, which leads to an obscuration of the pupil, facilitates a projection optical unit with a large image-side numerical aperture, in particular with a numerical aperture that is greater than 0.4, greater than 0.45 or greater than 0.5. The image-side numerical aperture can be 0.55 and can be even greater.

In some embodiments, the penultimate mirror in the imaging light beam path does not have a passage opening for passage of the imaging light. Such a mirror can be manufactured with acceptable outlay.

In some embodiments, the stop is arranged between two GI mirrors of the imaging optical unit, and/or the imaging optical unit has more than six mirrors with the stop arranged between the fifth and the sixth mirror in the imaging light beam path. Such a stop location was found to be particularly suitable.

In some embodiments, at least one of the intermediate images is arranged between two GI mirrors in the imaging light beam path. Such an arrangement of an intermediate image renders it possible to design the intermediate image to be easily accessible; this can be used to manipulate the imaging light beam at the location of this intermediate image.

In some embodiments, at least one of the intermediate images is arranged in the region of the passage opening in the imaging light beam path. Such an intermediate image arrangement leads, at least in one dimension, i.e. within one of the imaging light planes, to an advantageous construction of the imaging light beam in the region of the passage opening which can then have a small design. This reduces an obscuration of the imaging optical unit, the area of which can be smaller than 9% of the entire pupil of the imaging optical unit, in particular less than 6.25%, and which can be 2.25%, for example.

In some embodiments, an entrance pupil of the imaging optical unit is arranged upstream of the object field in the beam path of the imaging light. Such an entrance pupil facilitates the arrangement of a pupil-defining component of the illumination optical unit there, without further illumination-optical components having to be arranged between this component and the object.

In some embodiments, the pupil of the imaging optical unit has an obscuration, wherein provision is made of a stop for predefining at least one portion of an inner marginal contour of the obscuration of the pupil. Such an obscuration stop facilitates an illumination-angle-independent prescription of a pupil obscuration which, for example, can be caused by a mirror passage opening. The obscuration stop can be arranged adjacent to the stop predefining the outer pupil marginal contour. The obscuration stop can be arranged in the same plane as the stop predefining the outer pupil marginal contour. The obscuration stop can be applied directly onto a mirror reflection surface.

In some embodiments, an optical system includes an illumination optical unit for illuminating the object field with the imaging light, and an imaging optical unit according to the present disclosure. The advantages of such an optical system correspond to those which have already been explained above with reference to the imaging optical unit according to the disclosure.

In some embodiments, a projection exposure apparatus includes such an optical system and an EUV light source, which can be used in a method to make a microstructured or nanostructured component. The advantages of such an apparatus, such a method, and such a component correspond to those explained above with reference to the projection optical unit and the optical system and the projection exposure apparatus.

In particular, a semiconductor component, for example a memory chip, may be produced using the projection exposure apparatus.

BRIEF DESCRIPTION OF THE DRAWINGS

Exemplary embodiments of the disclosure are explained in greater detail below with reference to the drawing, in which.

DETAILED DESCRIPTION

Figure 1:
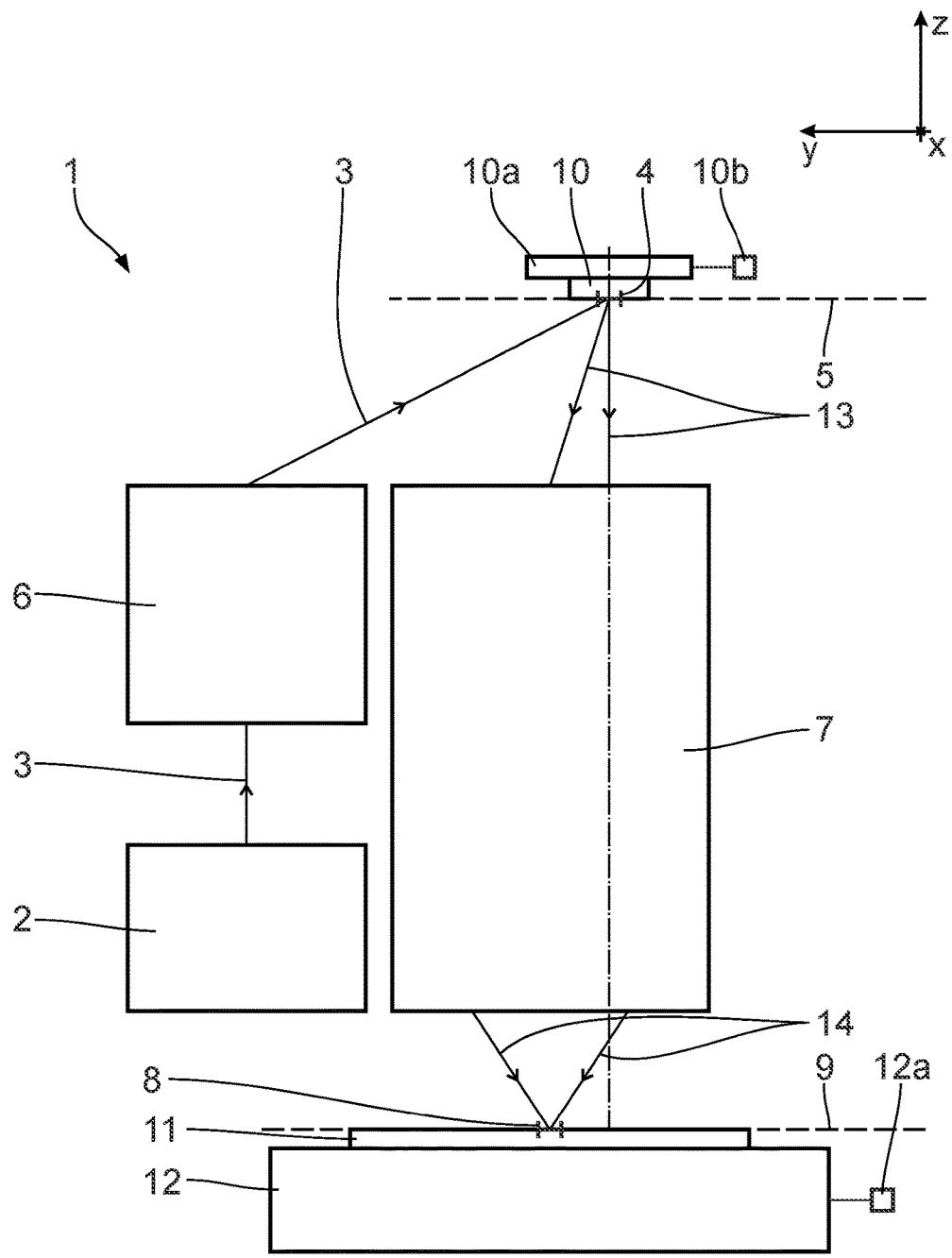
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. In particular, the light source 2 may be a light source with a wavelength of 13.5 nm or a light source with a wavelength of 6.9 nm. Other EUV wavelengths are also possible. In general, even arbitrary wavelengths are possible for the illumination light 3 guided in the projection exposure apparatus 1, for example visible wavelengths or else other wavelengths which may find use in microlithography (for example, DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale. The projection optical unit 7 has exactly one object field 4. The projection optical unit 7 has exactly one image field 8.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward.

The object field 4 and the image field 8 have a bent or curved embodiment, in particular a partial-ring-shaped embodiment, in the object plane 5 and in the image plane 9. Alternatively, it is also possible to embody the object field 4 and image field 8 with a rectangular shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Figure 2:
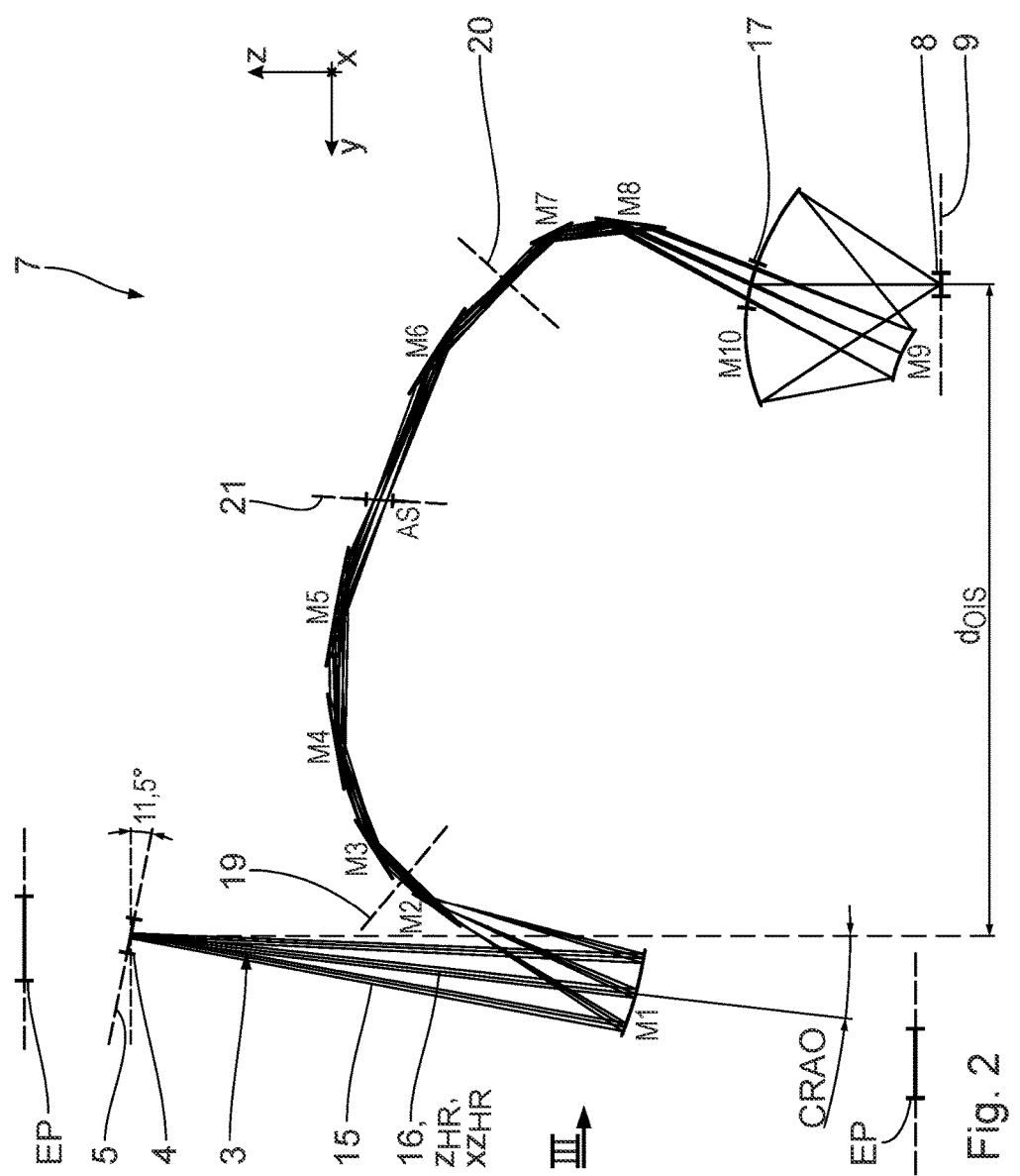
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of a plurality of selected field points is depicted.

The exemplary embodiment depicted in FIG. 2 can be used for the projection optical unit 7. The projection optical unit 7 is anamorphic, i.e. it has a different reduction scale in the x-direction (reduction scale in the xz-plane, i.e. in a first imaging light plane that is also referred to as sagittal plane) than in the y-direction (reduction scale in the yz-plane, i.e. in a second imaging light plane that is also referred to as meridional plane). The projection optical unit 7 has a reduction scale of 4 in the x-direction. The projection optical unit 7 has a reduction scale of 8 in the y-direction. Other reduction scales for the reduction in the x-direction and/or for the reduction in the y-direction are also possible, for example 4×, 5× or even reduction scales that are greater than 8×. In the x-direction, the projection optical unit 7 can have a reduction scale in the range between 4 and 5, for example a reduction scale in the range between 4.6 and 4.9, for example a reduction scale of 4.8. In the y-direction, the projection optical unit 7 can have a reduction scale in the range between 6 and 9, for example in the range between 7 and 8, and, in particular, in the region of 7.5. An embodiment of the projection optical unit 7 with the same reduction scales as these in, firstly, the xz-plane and, secondly, in the yz-plane is also possible.

A first imaging light plane $xz_{HR}$ is the plane which is spanned at the respective location of the beam path of the imaging light 3 by the first Cartesian object field coordinate x and a current imaging light main propagation direction $z_{HR}$. The imaging light main propagation direction $z_{HR}$ is the beam direction of a chief ray 16 of a central field point. As a rule, this imaging light main propagation direction $z_{HR}$ changes at each mirror reflection at the mirrors M1 to M10. This change can be described as a tilt of the current imaging light main propagation direction $z_{HR}$ about the first Cartesian object field coordinate x about a tilt angle which equals the deflection angle of this chief ray 16 of the central field point at the respectively considered mirror M1 to M10. Subsequently, the first imaging light plane $xz_{HR}$ is also referred to as first imaging light plane xz for simplification purposes.

The second imaging light plane yz likewise contains the imaging light main propagation direction $z_{HR}$ and is perpendicular to the first imaging light plane $xz_{HR}$.

Since the projection optical unit 7 is only folded in the meridional plane yz, the second imaging light plane yz coincides with the meridional plane.

In the projection optical unit 7, the image plane at 9 is tilted in relation to the object plane 5 by 11.5° about the x-axis. The image plane 9 can also be arranged parallel to the object plane 5. What is imaged by the projection optical unit 7 is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of the projection optical unit 7. FIG. 2 depicts the beam path of in each case three individual rays 15 emanating from a plurality of object field points which are spaced apart from one another in the y-direction in FIG. 2. What are depicted are chief rays 16, i.e. individual rays 15 which pass through the center of a pupil in a pupil plane of the projection optical unit 7, and in each case an upper coma ray and a lower coma ray of these two object field points. Proceeding from the object field 4, the chief ray 16 of a central object field point includes an angle CRAO of 5.1° with a normal on the object plane 5.

The projection optical unit 7 has an image-side numerical aperture of 0.55.

An entrance pupil EP is arranged in the beam path of the imaging light 3 upstream of the object field 4. Possible positions of the entrance pupil EP above the object plane 5 with the use of a reticle 10 that transmits the imaging light 3 and below the object plane 5 with the use of a reflective reticle 10 are indicated in each case in FIG. 2. This results in a divergent course of the chief rays 16 between the object field 4 and the mirror M1.

The projection optical unit 7 according to FIG. 2 has a total of ten mirrors, which are numbered consecutively by M1 to M10 in the order of the beam path of the individual rays 15, proceeding from the object field 4. The projection optical unit 7 is a purely catoptric optical unit. The imaging optical unit 7 can also have a different number of mirrors, for example four mirrors, six mirrors or eight mirrors. An odd number of mirrors is also possible in the projection optical unit 7.

FIG. 2 illustrates the calculated reflection surfaces of the mirrors M1 to M10. What can be identified in the illustration according to FIG. 2 is that only a portion of these calculated reflection surfaces is used. Only this actually used region of the reflection surfaces is actually present in the real mirrors M1 to M10. These used reflection surfaces are carried in a known manner by mirror bodies (not shown).

In the case of the projection optical unit 7 according to FIG. 2, the mirrors M1, M9 and M10 are embodied as normal incidence mirrors, that is to say as mirrors on which the imaging light 3 is incident with an angle of incidence that is less than 45°. Overall, the projection optical unit 7 according to FIG. 2 thus has three normal incidence mirrors M1, M9 and M10. Below, these mirrors are also referred to as NI mirrors.

The mirrors M2 to M8 are mirrors for grazing incidence of the illumination light 3, that is to say mirrors onto which the illumination light 3 impinges with angles of incidence that are greater than 60°. A typical angle of incidence of the individual rays 15 of the imaging light 3 on the mirrors M2 to M8 for grazing incidence lies in the region of 80°. Overall, the projection optical unit 7 according to FIG. 2 has exactly seven mirrors M2 to M8 for grazing incidence. Below, these mirrors are also referred to as GI mirrors.

The mirrors M2 to M8 reflect the imaging light 3 such that the angles of reflection of the individual rays 15 on the respective mirrors M2 to M8, and hence the deflection effect of the mirrors M2 to M8, add up.

The mirrors M1 to M10 carry a coating that optimizes the reflectivity of the mirrors M1 to M10 for the imaging light 3. The coating can be, in particular for the GI mirrors, a ruthenium coating, a molybdenum coating or a molybdenum coating with a topmost layer of ruthenium. Other coating materials can also be used. A coating including for example a layer of molybdenum or ruthenium can be used in the case of the grazing incidence mirrors M2 to M8. The highly reflecting layers, in particular of the mirrors M1, M9 and M10 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon.

Information concerning reflection at a GI mirror (grazing incidence mirror) can be found in WO 2012/126867 A. Further information concerning the reflectivity of NI mirrors (normal incidence mirrors) can be found in DE 101 55 711 A.

An overall reflectivity or system transmission of the projection optical unit 7, emerging as a product of the reflectivities of all mirrors M1 to M10 of the projection optical unit 7, is approximately R=7.8%.

The mirror M10, that is to say the last mirror upstream of the image field 8 in the imaging beam path, has a passage opening 17 for the passage of the imaging light 3 which is reflected from the antepenultimate mirror M8 toward the penultimate mirror M9. The mirror M10 is used in a reflective manner around the passage opening 17. None of the other mirrors M1 to M9 has passage openings and the mirrors are used in a reflective manner in a continuous region without gaps.

In the first imaging light plane xz, the projection optical unit 7 has exactly one first plane intermediate image 18 in the imaging beam path in the region of the passage of the imaging light 3 through the passage opening 17 in the mirror M10. This first plane intermediate image 18 lies between the mirrors M8 and M9 in the imaging light beam path. In the z-direction, a distance between the passage opening 17 and the image field 8 is more than four times greater than a distance between the passage opening 17 and the first plane intermediate image 18.

In the second imaging light plane yz that is perpendicular to the first imaging light plane xz, i.e. in the meridional plane illustrated in FIG. 2, the imaging light 3 passes through exactly two second plane intermediate images 19 and 20. The first one of these two second plane intermediate images 19 lies in the region of the reflection of the imaging light 3 at the mirror M3 in the imaging light beam path. The other of the two second plane intermediate images 20 lies between the mirrors M6 and M7 in the imaging light beam path.

The number of the first plane intermediate images, i.e. exactly one first plane intermediate image in the projection optical unit 7, and the number of the second plane intermediate images, i.e. exactly two second plane intermediate images in the projection optical unit 7, differ from one another in the projection optical unit 7. In the projection optical unit 7, this number of intermediate images differs by exactly one. The second imaging light plane yz, in which the greater number of intermediate images, namely the two second plane intermediate images 19 and 20, are present, coincides with the folding plane yz of the GI mirrors M2 to M8. This folding plane is the plane of incidence of the chief ray 16 of the central field point upon reflection at the respective GI mirror. The second plane intermediate images are not, as a rule, perpendicular to the chief ray 16 of the central field point which defines the imaging light main propagation direction $z_{HR}$. An intermediate image tilt angle, i.e. a deviation from this perpendicular arrangement, is arbitrary as a matter of principle and may lie between 0° and +/−89°.

The projection optical unit 7 has exactly one stop AS for predefining an outer marginal contour of a pupil in the region of a pupil plane 21 of the projection optical unit 7. This exactly one stop AS can predefine a section of this outer marginal contour of the pupil or predefine the entire outer marginal contour of the pupil.

The stop AS is arranged spatially in front of a penultimate mirror in the imaging light beam path, i.e. upstream of the mirror M9 in the imaging light beam path. In particular, the stop AS is arranged upstream of the antepenultimate mirror M8 in the imaging light beam path. In the illustrated embodiment, the stop AS is arranged between the mirrors M5 and M6 in the imaging light beam path. The stop AS is embodied with a three-dimensional (3D) profile of the inner marginal contour. In the illustrated embodiment of the projection optical unit 7, both the stop AS and an obscuration stop of the projection optical unit 7 in each case lie on a spherical surface. Alternatively, the stop AS can have an inner marginal contour that lies in a plane; i.e., it can be embodied with a stop body with an entirely planar embodiment, the stop body having this inner stop marginal contour. In a further variant, the stop AS can be embodied with a stop body that only has a planar embodiment in sections.

The locations of the intermediate images 18 to 20 on the one hand and the curvatures of the mirrors M1 to M10 on the other hand are matched to one another in such a way that, in the first imaging light plane $xz_{HR}$, the pupil that is arranged between the object plane 5 and the first plane intermediate image 18 and, in the second imaging light plane yz, the pupil that lies between the two second plane intermediate images 19, 20 respectively come to rest at the location of the aperture stop AS in the region of the pupil plane 21. Hence, the single stop AS is enough to predefine the outer marginal contour of the pupil of the projection optical unit 7.

At the location of the stop AS, an entire beam of the imaging light 3 is completely accessible from the outside over its entire circumference.

The extent of the stop AS can be smaller in the scan direction y than in the cross scan direction x.

The non-illuminated obscuration region in the system pupil, which is predefined by the obscuration stop that was already mentioned above, can be round, elliptical, square or rectangular. Moreover, this surface in the system pupil which cannot be illuminated can be decentered in the x-direction and/or in the y-direction in relation to a center of the system pupil. As an alternative to an obscuration stop having a 3D profile of the outer marginal contour, use can also be made of an obscuration stop with a different marginal contour profile or with a different stop body design, as was described above in conjunction with the aperture stop AS.

The mirrors M1 to M10 are embodied as free-form surfaces which cannot be described by a rotationally symmetric function. Other embodiments of the projection optical unit 7, in which at least one of the mirrors M1 to M10 is embodied as a rotationally symmetric asphere, are also possible. It is also possible for all mirrors M1 to M10 to be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \\ C_1 x + C_2 y + C_3 x^2 + C_4 xy + C_5 y^2 + C_6 x^3 + \ldots + \\ C_9 y^3 + C_{10} x^4 + \ldots + C_{12} x^2 y^2 + \ldots C_{14} y^4 + C_{15} x^5 + \\ \ldots + C_{20} y^5 + C_{21} x^6 + \ldots + C_{24} x^3 y^3 + \ldots + C_{27} y^6 + \ldots \tag{1}$$

The following applies to the parameters of this equation (1):

Z is the sag of the free-form surface at the point x, y, where $x^2 + y^2 = r^2$. Here, r is the distance from the reference axis of the free-form equation (x=0; y=0).

In the free-form surface equation (1), $C_1$, $C_2$, $C_3$ ... denote the coefficients of the free-form surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. Here, $k_x$ and $k_y$ each correspond to a conical constant of a corresponding asphere. Thus, equation (1) describes a biconical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007 0 058 269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using for example polynomials or functions which have specific properties in respect of the continuity and the differentiability thereof. Examples for this are analytical functions.

Figure 4:
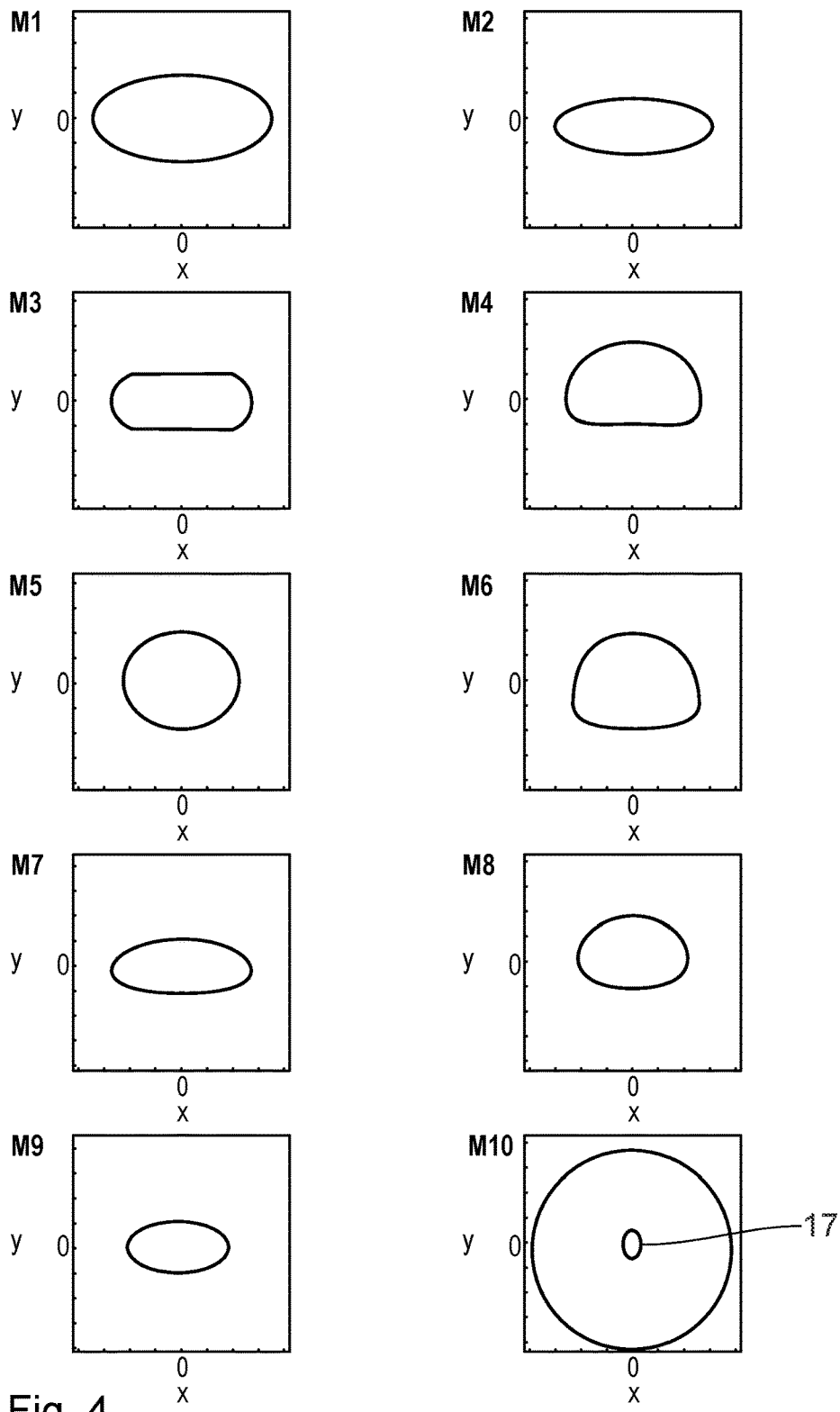
FIG. 4 shows plan views of marginal contours of optically used surfaces of the mirrors of the imaging optical unit according to FIG. 2.

FIG. 4 shows marginal contours of the reflection surfaces in each case impinged upon by the imaging light 3 on the mirrors M1 to M10 of the projection optical unit 7, i.e. the so-called footprints of the mirrors M1 to M10. These marginal contours are in each case depicted in an x/y-diagram, which corresponds to the local x- and y-coordinates of the respective mirror M1 to M10. Moreover, the form of the passage opening 17 is depicted in the illustration relating to the mirror M10.

The two tables below summarize the parameters "Maximum angle of incidence", "Extent of the reflection surface in the x-direction", "Extent of the reflection surface in the y-direction" and "Maximum mirror diameter" for the mirrors M1 to M10.

|  | M1 | M2 | M3 | M4 | M5 |
|---|---|---|---|---|---|
| Maximum angle of incidence [°] | 11.5 | 86.4 | 80.4 | 82.7 | 81.1 |
| Extent of the reflection surface in the x-direction [mm] | 686.8 | 569.3 | 536.3 | 496.9 | 438.2 |
| Extent of the reflection surface in the y-direction [mm] | 288.8 | 194.9 | 211.5 | 326.0 | 384.4 |
| Maximum mirror diameter [mm] | 687.0 | 569.3 | 538.0 | 505.1 | 446.2 |

|  | M6 | M7 | M8 | M9 | M10 |
|---|---|---|---|---|---|
| Maximum angle of incidence [°] | 80.2 | 75.4 | 76.7 | 21.2 | 13.8 |
| Extent of the reflection surface in the x-direction [mm] | 435.3 | 449.7 | 370.3 | 379.0 | 796.9 |
| Extent of the reflection surface in the y-direction [mm] | 324.5 | 153.2 | 217.1 | 190.0 | 785.4 |
| Maximum mirror diameter [mm] | 457.1 | 449.8 | 370.3 | 379.1 | 801.0 |

The mirror M10 that predefines the image-side numerical aperture has the largest maximum mirror diameter, with a diameter of 801 mm. None of the other mirrors M1 to M9 has a maximum diameter that is greater than 700 mm. Eight of the ten mirrors, namely the mirrors M2 to M9, have a maximum mirror diameter that is less than 570 mm. Five of the ten mirrors, namely the mirrors M5 to M9, have a maximum mirror diameter that is less than 460 mm.

The optical design data of the reflection surfaces of the mirrors M1 to M10 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first of these tables provides an overview of the design data of the projection optical unit 7 and summarizes the numerical aperture NA, the calculated design wavelength for the imaging light, the dimensions of the image field in the x-direction and y-direction, image field curvature, a wavefront aberration rms, and a stop location. This curvature is defined as the inverse radius of curvature of the field.

The image field 8 has an x-extent of two-times 13 mm and a y-extent of 1.2 mm. The projection optical unit 7 is optimized for an operating wavelength of the illumination light 3 of 13.5 nm. The wavefront aberration rms is 12.8 mλ.

The second of these tables indicates vertex point radii (Radius_x=$R_x$, Radius_y=$R_y$) and refractive power values (Power_x, Power_y) for the optical surfaces of the optical components. Negative radii values denote curves that are concave toward the incident illumination light 3 at the intersection of the respective surface with the considered plane (xz, yz) that is spanned by a surface normal at the vertex point with the respective direction of curvature (x,y). The two radii Radius_x, Radius_y may explicitly have different signs.

The vertex points at each optical surface are defined as points of incidence of a guide ray which travels from an object field center to the image field 8 along a plane of symmetry x=0, i.e. the plane of the drawing of FIG. 2 (meridional plane).

The refractive powers Power_x ($P_x$), Power_y ($P_y$) at the vertex points are defined as:

$$P_x = -\frac{2\cos AOI}{R_x}$$

$$P_y = -\frac{2}{R_y \cos AOI}$$

Here, AOI denotes an angle of incidence of the guide ray with respect to the surface normal.

The third table indicates for the mirrors M1 to M10 in mm the conic constants $k_x$ and $k_y$, the vertex point radius $R_x$ (=Radius_x) and the free-form surface coefficients $C_n$. Coefficients $C_n$ that are not tabulated have the value 0 in each case.

The fourth table also indicates the magnitude along which the respective mirror, proceeding from a reference surface, was decentered (DCY) in the y-direction, and displaced (DCZ) and tilted (TLA, TLB, TLC) in the z-direction. This corresponds to a parallel shift and a tilting in the case of the freeform surface design method. Here, a displacement is carried out in the y-direction and in the z-direction in mm, and tilting is carried out about the x-axis, about the y-axis and about the z-axis. In this case, the angle of rotation is specified in degrees. Decentering is carried out first, followed by tilting. The reference surface during decentering is in each case the first surface of the specified optical design data. Decentering in the y-direction and in the z-direction in the object plane 5 is also specified for the object field 4. In addition to the surfaces assigned to the individual mirrors, the fourth table also tabulates the image plane as the first surface, the object plane as the last surface and a stop surface (with the stop label "AS") of the stop AS.

The fifth table specifies the transmission data of the mirrors M10 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table specifies an inner boundary of the stop AS as a polygonal line in local co-ordinates xyz. As described above, the stop is decentered and tilted. The respective stop type of the polygonal line indicated is also mentioned in the last column of table 6. "CLA" here denotes a stop boundary that is transparent inward, that is to say toward a stop center, and is blocking outward (type aperture stop). An aperture stop boundary serves to define an outer delimitation of a pupil of the projection optical unit 7. The additional obscuration stop serves to define an obscured region situated in the interior of the pupil.

The obscuration stop can be arranged on the same surface, for example spherical or aspherical or a planar surface, as the aperture stop AS. Alternatively, the obscuration stop can also lie on an arrangement surface that is separate from the arrangement surface of the aperture stop AS.

The seventh table specifies an outer boundary of the obscuration stop as a polygonal line in local coordinates xyz, in a manner analogous to the sixth table. As described above, the obscuration stop is also decentered and tilted. In the case described by way of the design tables, the obscuration stop is arranged on the same surface as the aperture stop.

A boundary of a stop surface of the stop AS (cf., also, tables 6 and 7 for FIG. 2) emerges from intersection points on the stop surface of all rays of the illumination light 3 which, on the image side, propagate at selected field points in the direction of the stop surface with a complete image-side telecentric aperture. To predetermine the boundary of the stop surface of the stop AS, use is made of the intersection points on the stop surface of all rays of the illumination light 3 which, on the image side, propagate from the field center point in the direction of the stop surface with a complete image-side telecentric aperture. To predetermine the boundary of the obscuration stop, use is made of the intersection points 3 of all rays of the illumination light at the stop surface which, on the image side, propagate from the field center point in the direction of the stop surface with an image-side telecentric aperture, which results in a complete obscuration of the passage opening 17 of the mirror M10 for all field points.

In principle, there may also be a different selection of the employed image-side field points when defining the stop. The "field center point" and "overall field" selections are the possible extreme situations in this case.

When the stop is embodied as an aperture stop, the boundary is an inner boundary. In the case of an embodiment as an obscuration stop, the boundary is an outer boundary.

The respective stop can lie in a plane or else have a three-dimensional embodiment. The extent of the stop can be smaller in the scan direction (y) than in the cross scan direction (x).

Table 1 for FIG. 2

| Exemplary embodiment | FIG. 2 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.2 mm |
| Field curvature | −0.012345 1/mm |
| rms | 12.8 ml |
| Stop | AS |

Table 2 for FIG. 2

| Surface | Radius_x[mm] | Power_x[1/mm] | Radius_y[mm] | Power_y[1/mm] | Operation |
|---|---|---|---|---|---|
| M10 | −822.0391694 | 0.0023757 | −745.0944866 | 0.0027489 | REFL |
| M9 | 5428.3780482 | −0.0003684 | 428.1801828 | −0.0046709 | REFL |
| M8 | −682.4490198 | 0.0008476 | 10617.6367533 | −0.0006513 | REFL |
| M7 | −824.9942389 | 0.0007573 | −72426.2221876 | 0.0000884 | REFL |
| M6 | −4087.4276655 | 0.0001001 | −4166.4289960 | 0.0023462 | REFL |
| M5 | 6430.4369302 | −0.0000584 | −5962.0536517 | 0.0017867 | REFL |
| M4 | 1927998.93098 | −0.0000002 | −15936.1600783 | 0.0007553 | REFL |
| M3 | 61326.6945678 | −0.0000071 | −3872.4920654 | 0.0023873 | REFL |
| M2 | 9298.4261196 | −0.0000403 | 1252.5250662 | −0.0085278 | REFL |
| M1 | −2958.7393791 | 0.0006682 | −1235.3843127 | 0.0016378 | REFL |

Table 3a for FIG. 2

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −822.03916940 | 5428.37804800 | −682.44901980 |
| C7 | 7.59561009e−09 | −1.19177033e−06 | 5.54997227e−07 |
| C9 | −6.19967923e−09 | −1.42046134e−06 | 1.98239928e−07 |
| C10 | −1.167041e−11 | 6.47623499e−10 | 7.77846837e−11 |
| C12 | −7.35665349e−11 | 4.28782292e−09 | −6.83063172e−10 |
| C14 | −3.23120308e−11 | 3.9252927e−09 | 9.24231955e−10 |
| C16 | −8.03639272e−15 | −2.16430637e−12 | 3.54075231e−13 |
| C18 | −2.06825179e−14 | −8.06283678e−12 | 4.76535109e−13 |
| C20 | −1.62936876e−14 | −5.59600456e−12 | 4.76262966e−13 |
| C21 | −3.13127772e−17 | 1.26888436e−15 | −1.94102344e−16 |
| C23 | −1.85374575e−16 | 1.38192332e−14 | −7.92445209e−16 |
| C25 | −2.07270045e−16 | 2.85005583e−14 | −1.31972871e−16 |
| C27 | −6.93618689e−17 | 4.38316209e−14 | 2.77921488e−14 |
| C29 | −2.46301384e−20 | −9.09940987e−18 | 3.75702546e−18 |
| C31 | −6.41372794e−20 | −4.5605694e−17 | −1.30280294e−18 |
| C33 | −7.52551053e−20 | −1.58013183e−16 | 1.49190752e−17 |
| C35 | −2.75825038e−20 | −7.20345575e−17 | 1.6943071e−16 |
| C36 | −5.37238002e−23 | 4.05367876e−22 | 7.70463206e−22 |

-continued

| Table 3a for FIG. 2 | | | |
|---|---|---|---|
| Coefficient | M10 | M9 | M8 |
| C38 | −3.95381455e−22 | 6.83731083e−20 | −1.96698939e−20 |
| C40 | −6.96244222e−22 | 3.38190484e−19 | 6.40290038e−21 |
| C42 | −5.21487827e−22 | 7.29074558e−19 | 1.11504556e−19 |
| C44 | −1.34959021e−22 | 3.50809955e−19 | 9.60273288e−19 |
| C46 | −5.91785289e−26 | −4.58241546e−23 | 1.26095833e−23 |
| C48 | −1.49617548e−25 | −2.61245246e−22 | 1.60323716e−22 |
| C50 | −2.56839452e−25 | −1.30349394e−21 | 2.18286385e−22 |
| C52 | −1.81238889e−25 | −6.17578113e−22 | −4.22912447e−22 |
| C54 | −7.35409036e−26 | −7.03044681e−21 | 4.72760558e−21 |
| C55 | −1.5007842e−28 | 1.20610026e−25 | 2.45668115e−28 |
| C57 | −6.52632447e−28 | 2.48535225e−25 | 7.93364406e−26 |
| C59 | −1.53511583e−27 | 7.13043882e−25 | 5.25292027e−25 |
| C61 | −1.68489496e−27 | −8.22311668e−24 | −1.33723344e−24 |
| C63 | −8.76982094e−28 | −2.39063206e−25 | −9.40665782e−24 |
| C65 | −1.70785567e−28 | 5.68827539e−24 | 5.26704248e−23 |
| C67 | 6.98211817e−32 | 6.03172492e−29 | −4.17178867e−28 |
| C69 | −4.7125227e−31 | −5.01560548e−27 | −3.16044938e−27 |
| C71 | −1.07904671e−30 | −3.6564895e−26 | −1.23790518e−26 |
| C73 | −1.15295936e−30 | −1.43791476e−25 | −3.12653239e−27 |
| C75 | −5.40809988e−31 | −5.38749394e−26 | 2.63972545e−25 |
| C77 | 5.74595716e−32 | 1.17541858e−24 | 8.9201918e−25 |
| C78 | −1.72065347e−34 | −1.80558412e−30 | −1.73387342e−31 |
| C80 | −2.61593158e−33 | 6.14017128e−30 | −1.41360533e−31 |
| C82 | −7.59270432e−33 | 1.14077832e−28 | −2.47093107e−29 |
| C84 | −1.27658562e−32 | 9.64247712e−28 | 2.81462628e−30 |
| C86 | −1.16778869e−32 | 2.81211322e−27 | 1.02972785e−27 |
| C88 | −5.66756592e−33 | −2.37387626e−28 | 5.86153499e−27 |
| C90 | −1.16036421e−33 | 4.01969657e−28 | 8.31485561e−27 |
| C92 | −5.06043217e−37 | −6.13309682e−33 | 5.54160746e−33 |
| C94 | 4.38076529e−37 | 3.69118814e−32 | 4.91610826e−32 |
| C96 | 5.0293366e−37 | 6.69529176e−31 | 3.26156085e−31 |
| C98 | 1.09675852e−36 | 4.79090217e−30 | 2.48876295e−30 |
| C100 | 1.04217188e−36 | 1.70057971e−29 | 1.17292031e−29 |
| C102 | −3.05640297e−37 | −9.11259717e−30 | 4.02030804e−29 |
| C104 | −8.01140127e−37 | −9.50716715e−29 | 3.72614845e−29 |
| C105 | 2.43051957e−40 | 1.81108887e−35 | 1.48296038e−36 |
| C107 | 3.46214151e−39 | −7.04483078e−35 | −4.17109372e−35 |
| C109 | 1.133791e−38 | −1.72065752e−33 | 3.31038732e−34 |
| C111 | 2.93088638e−38 | −2.48878155e−32 | 3.23600692e−33 |
| C113 | 3.88912762e−38 | −1.30148605e−31 | 1.31843764e−32 |
| C115 | 3.1050795e−38 | −2.35354704e−31 | 3.60231946e−32 |
| C117 | 1.43129644e−38 | 7.77010646e−32 | 9.47529027e−32 |
| C119 | 2.75428522e−39 | 7.22333019e−32 | 6.4548391e−32 |
| C121 | 1.37666925e−43 | 3.45037391e−38 | 0 |
| C123 | −4.99513875e−42 | −6.15580923e−37 | 0 |
| C125 | −1.60772039e−41 | −9.29396055e−36 | 0 |
| C127 | −2.91572729e−41 | −7.44976477e−35 | 0 |
| C129 | −3.32978221e−41 | −3.54700943e−34 | 0 |
| C131 | −2.17433993e−41 | −8.73189441e−34 | 0 |
| C133 | −5.89068623e−42 | 4.26657992e−34 | 0 |
| C135 | 3.91052027e−43 | 3.02191312e−33 | 0 |
| C136 | −1.86049826e−45 | −7.73091643e−41 | 0 |
| C138 | −2.07787002e−44 | 8.6514443e−40 | 0 |
| C140 | −8.42360789e−44 | 1.48526056e−38 | 0 |
| C142 | −2.15483226e−43 | 2.6152836e−37 | 0 |
| C144 | −3.3067953e−43 | 1.90462418e−36 | 0 |
| C146 | −3.13907312e−43 | 6.6877486e−36 | 0 |
| C148 | −1.89667844e−43 | 9.16712464e−36 | 0 |
| C150 | −6.71152562e−44 | −2.56154469e−36 | 0 |
| C152 | −1.01446084e−44 | −4.24198041e−36 | 0 |

| Table 3b for FIG. 2 | | | |
|---|---|---|---|
| Coefficient | M7 | M6 | M5 |
| KY | 0.00000000 | 0.00000000 | 0.00000000 |
| KX | 0.00000000 | 0.00000000 | 0.00000000 |
| RX | −824.99423890 | −4087.42766600 | 6430.43693000 |
| C7 | −3.1340404e−07 | 1.35287185e−07 | −2.62002062e−08 |
| C9 | 5.79256608e−07 | −1.39363488e−08 | 9.90693269e−08 |
| C10 | 1.40347959e−10 | 1.70420567e−12 | 4.15575016e−10 |
| C12 | −1.47065796e−09 | −1.79581243e−11 | 9.79308809e−11 |

Table 3b for FIG. 2

| Coefficient | M7 | M6 | M5 |
|---|---|---|---|
| C14 | 1.3453307e−09 | −8.23743298e−11 | 1.99536062e−13 |
| C16 | 8.67891282e−13 | 1.38567624e−13 | −2.21691313e−13 |
| C18 | −8.32975575e−12 | 1.76087962e−13 | 2.06413215e−13 |
| C20 | 1.13878406e−11 | 3.44898684e−14 | 2.69841551e−13 |
| C21 | 2.34274578e−18 | 7.01120328e−17 | 5.85148086e−16 |
| C23 | 1.28381118e−14 | −5.02897048e−17 | 5.37230528e−16 |
| C25 | −4.47305169e−14 | −3.93398589e−16 | 3.98906992e−16 |
| C27 | 1.69149633e−15 | −9.860191e−17 | 6.42052433e−16 |
| C29 | −7.08200417e−18 | 3.02460634e−19 | −7.28197823e−19 |
| C31 | 6.99791979e−17 | 1.06124123e−18 | 8.41172933e−19 |
| C33 | −9.18154271e−17 | 4.36407254e−19 | 1.55913103e−18 |
| C35 | 2.38841451e−16 | 2.09962046e−19 | 1.33260902e−18 |
| C36 | 2.07181756e−21 | −4.39142639e−21 | −1.6017644e−21 |
| C38 | −4.75222454e−20 | −8.27891722e−22 | 3.10914655e−21 |
| C40 | 3.01628341e−19 | −2.92032152e−21 | 2.10790363e−21 |
| C42 | −8.44315543e−19 | −2.50009361e−21 | 5.86576134e−21 |
| C44 | 5.45071272e−19 | −1.65718978e−21 | 3.0232953e−21 |
| C46 | 9.84751469e−24 | −6.28524288e−24 | 6.30486276e−24 |
| C48 | −3.31300798e−22 | 5.88641092e−24 | −5.80921568e−25 |
| C50 | 1.60018067e−21 | 8.85580637e−24 | −3.73224821e−24 |
| C52 | −1.49156749e−20 | 1.0312708e−23 | 2.13966448e−23 |
| C54 | −6.02161594e−21 | −4.24623113e−25 | 2.32274629e−23 |
| C55 | −2.20639347e−26 | 1.04413245e−25 | 6.94071335e−26 |
| C57 | 1.89155613e−25 | 2.32469014e−27 | −4.62405e−27 |
| C59 | −3.42825341e−24 | −1.81332709e−26 | −1.49726766e−27 |
| C61 | 4.88548936e−23 | −2.93409303e−26 | 5.75560211e−26 |
| C63 | 2.20317132e−24 | −4.64804559e−27 | 1.8916126e−25 |
| C65 | 1.98540374e−22 | 8.76350391e−26 | 2.32815141e−25 |
| C67 | 8.07299964e−29 | 1.35769109e−28 | −2.20093457e−28 |
| C69 | 1.99668103e−27 | 8.15161626e−29 | 9.94130808e−29 |
| C71 | −8.70533717e−26 | 1.51629822e−28 | 3.44776655e−28 |
| C73 | 2.12404698e−25 | −1.71630005e−28 | 4.44179448e−28 |
| C75 | 5.93838164e−25 | −3.30050148e−28 | −1.23472447e−28 |
| C77 | 8.26112935e−25 | 1.18311748e−28 | −1.61332177e−28 |
| C78 | 3.16769159e−31 | −1.14694865e−30 | −6.16362578e−31 |
| C80 | −4.40542213e−31 | −2.37986663e−31 | 2.12868021e−31 |
| C82 | 1.51291736e−28 | −1.74643498e−31 | 6.14815897e−31 |
| C84 | −4.56348886e−28 | 1.33256532e−31 | 7.5688032e−31 |
| C86 | −1.47625002e−27 | 9.7899966e−31 | −6.18045007e−31 |
| C88 | −2.09750998e−26 | 2.11514184e−32 | −4.43988247e−30 |
| C90 | −3.13102466e−26 | −2.37554977e−30 | −4.75711732e−30 |
| C92 | −4.12844674e−33 | −1.03001112e−33 | 1.45522221e−33 |
| C94 | −1.16018183e−31 | −2.41855973e−34 | −1.09144759e−33 |
| C96 | 1.14422228e−31 | −2.06083988e−33 | −3.29107344e−33 |
| C98 | 4.92624469e−32 | −1.82557551e−33 | −3.73868154e−33 |
| C100 | 2.5557089e−29 | 5.09427205e−33 | −1.7462798e−33 |
| C102 | 1.4088188e−28 | 4.74548242e−33 | 1.61691781e−32 |
| C104 | 2.60040854e−28 | −1.92999857e−33 | 1.08678166e−32 |
| C105 | −9.81057755e−37 | 4.25801007e−36 | 2.85309864e−36 |
| C107 | 7.97530998e−35 | 1.87178727e−36 | −1.98939532e−36 |
| C109 | −3.89519861e−34 | 1.15967982e−36 | −7.17267354e−36 |
| C111 | 3.86044968e−33 | 8.24232024e−36 | −1.0299072e−35 |
| C113 | −1.91026134e−32 | −3.78900617e−36 | −2.12821395e−36 |
| C115 | −4.31893614e−32 | −2.33761849e−35 | 2.80213497e−35 |
| C117 | −3.78137324e−31 | −2.56053801e−36 | 1.06932752e−34 |
| C119 | −7.49161891e−31 | 2.43676088e−35 | 9.30564684e−35 |

Figure 3:
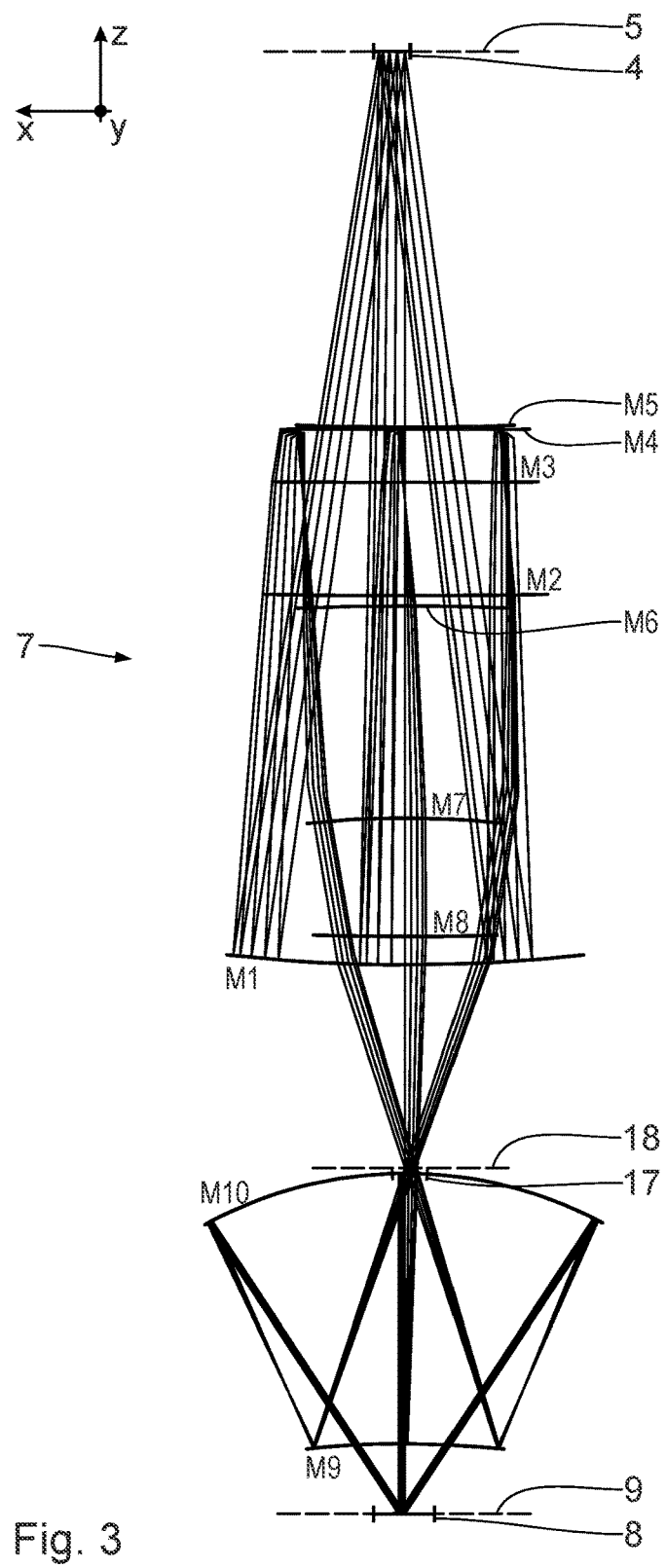
FIG. 3 shows a view of the projection optical unit according to FIG. 2, according to the viewing direction III in FIG. 2.

Table 3c for FIG. 3

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | 1927998.93100000 | 61326.69457000 | 9298.42612000 |
| C7 | −6.81580208e−09 | 4.77227006e−08 | 1.80052827e−08 |
| C9 | −2.25247271e−08 | −2.50332776e−07 | −1.5897532e−06 |
| C10 | −1.79825558e−12 | 9.14107547e−11 | 8.09785691e−11 |
| C12 | −9.17958602e−14 | 5.62224913e−11 | 2.30460463e−10 |
| C14 | −1.2807517e−10 | −2.56233324e−10 | 5.89246016e−09 |
| C16 | −1.35864855e−13 | 9.66129034e−15 | 3.91670202e−13 |
| C18 | 5.78649145e−14 | 2.09706737e−13 | 5.34285417e−13 |
| C20 | −2.37870869e−13 | −2.27559538e−12 | −1.82965502e−11 |

Table 3c for FIG. 3

| Coefficient | M4 | M3 | M2 |
| --- | --- | --- | --- |
| C21 | −5.03388139e−16 | 6.42611824e−18 | 1.90700914e−16 |
| C23 | −9.55277193e−18 | 2.73042231e−17 | −2.54646577e−15 |
| C25 | 3.34585921e−17 | 3.26568385e−16 | −5.32389404e−15 |
| C27 | −1.2974972e−15 | 3.57453712e−16 | 3.49809571e−14 |
| C29 | 2.77482397e−19 | 2.99079615e−19 | 2.23894036e−19 |
| C31 | −8.56146007e−19 | −1.97192241e−18 | 7.50780376e−18 |
| C33 | 3.01055654e−19 | 3.4495392e−18 | 3.15087397e−17 |
| C35 | −3.69149641e−18 | −3.77345722e−17 | 2.49491199e−17 |
| C36 | 2.65124644e−21 | 5.30483872e−22 | −9.79523506e−22 |
| C38 | −5.46646926e−22 | 5.48873916e−22 | 2.27635583e−21 |
| C40 | 2.2168182e−21 | 3.840318e−21 | 2.56933038e−20 |
| C42 | 3.76939335e−21 | 9.07536816e−21 | −4.83398272e−20 |
| C44 | −1.86457946e−20 | 9.63668394e−20 | −5.45493641e−19 |
| C46 | 5.24731609e−24 | 2.5631708e−25 | −3.20750645e−24 |
| C48 | 4.86264022e−24 | 1.51330483e−24 | −4.38348996e−23 |
| C50 | −1.82040473e−26 | −3.97798774e−23 | −6.42761819e−22 |
| C52 | 1.13009972e−23 | −1.73488434e−23 | −7.42447451e−22 |
| C54 | −6.22344466e−23 | −6.35455496e−22 | 2.12120942e−21 |
| C55 | −5.6662751e−26 | −9.53950513e−27 | 1.92131492e−26 |
| C57 | −6.52204912e−27 | −8.08699015e−28 | 9.13682672e−27 |
| C59 | −2.68165153e−26 | −2.96986005e−26 | 2.68813966e−25 |
| C61 | −5.34696982e−26 | −1.24373567e−25 | 5.60581756e−24 |
| C63 | −9.24872883e−26 | −3.0952415e−25 | 4.68928507e−24 |
| C65 | −3.01545302e−25 | −9.31651538e−26 | 4.9930005e−23 |
| C67 | −7.16203673e−29 | 1.82453847e−29 | 2.71289579e−29 |
| C69 | −6.67462975e−29 | −6.69383027e−30 | 2.7415079e−28 |
| C71 | −3.91374995e−29 | −1.03144138e−28 | 6.79064423e−29 |
| C73 | −7.40659943e−29 | 8.70571645e−28 | −3.9179368e−26 |
| C75 | −6.94142135e−28 | 3.60168545e−27 | −5.78212519e−26 |
| C77 | −1.91855995e−27 | −4.10222726e−26 | −1.64936448e−24 |
| C78 | 5.04286053e−31 | 6.03170016e−32 | −1.3868818e−31 |
| C80 | 2.39232162e−31 | −4.12626061e−32 | −1.55612342e−31 |
| C82 | 4.80826798e−31 | 5.04668712e−31 | −2.30893545e−30 |
| C84 | 3.6212218e−31 | 4.35794799e−30 | −2.76456591e−30 |
| C86 | 3.97153357e−30 | 4.9603724e−30 | 1.48879199e−28 |
| C88 | 1.4192188e−30 | 1.98634517e−29 | 1.20402881e−27 |
| C90 | −1.11362398e−29 | 3.78574516e−28 | 1.98557688e−26 |
| C92 | 4.4205472e−34 | −1.09205305e−34 | −1.37766474e−34 |
| C94 | 3.22514903e−34 | −6.84731866e−35 | −1.40137894e−33 |
| C96 | 1.1716091e−34 | 6.76421975e−34 | 1.6988262e−33 |
| C98 | −1.07007682e−33 | −5.34712961e−33 | 1.08683924e−31 |
| C100 | 6.26665774e−33 | −9.27174473e−32 | 7.96489557e−31 |
| C102 | 2.22416397e−32 | −1.204422e−32 | −1.00300479e−29 |
| C104 | −3.20471058e−32 | −8.3878196e−31 | −1.09064529e−28 |
| C105 | −1.90445089e−36 | −1.02129599e−37 | 3.96432147e−37 |
| C107 | −1.56025862e−36 | 2.36644674e−37 | 1.20962825e−36 |
| C109 | −3.46402682e−36 | −1.56907564e−36 | 1.12989419e−35 |
| C111 | 6.03624666e−36 | −2.4846533e−35 | −3.4314462e−35 |
| C113 | −3.9474095e−35 | −3.1675326e−35 | −1.02169171e−33 |
| C115 | −6.76215332e−36 | 2.56229693e−34 | −6.38341573e−33 |
| C117 | 5.59159869e−35 | −4.89077515e−34 | 2.89783305e−32 |
| C119 | −3.73650661e−35 | −2.13674351e−33 | 2.28957713e−31 |

Table 3d for FIG. 2

| Coefficient | M1 |
| --- | --- |
| KY | 0.00000000 |
| KX | 0.00000000 |
| RX | −2958.73937900 |
| C7 | −9.49003659e−09 |
| C9 | 3.07193009e−08 |
| C10 | −8.91262932e−12 |
| C12 | −1.13758617e−11 |
| C14 | −1.21700955e−10 |
| C16 | 7.60923595e−15 |
| C18 | −3.99711358e−14 |
| C20 | 8.41607327e−14 |
| C21 | −4.16246415e−18 |
| C23 | 2.26653042e−17 |
| C25 | 3.87395288e−17 |
| C27 | −8.16460404e−16 |

-continued

Table 3d for FIG. 2

| Coefficient | M1 |
| --- | --- |
| C29 | −2.63873242e−21 |
| C31 | 7.25194268e−21 |
| C33 | −4.32824596e−19 |
| C35 | 9.64157893e−19 |
| C36 | 1.48063571e−23 |
| C38 | −1.6894394e−23 |
| C40 | −3.50470157e−22 |
| C42 | −2.03042038e−22 |
| C44 | −6.10889397e−21 |
| C46 | −1.31684509e−27 |
| C48 | 3.02885549e−26 |
| C50 | 1.50022249e−24 |
| C52 | −5.54826497e−24 |
| C54 | 4.23012006e−23 |

Table 3d for FIG. 2

| Coefficient | M1 |
|---|---|
| C55 | −1.88656326e−28 |
| C57 | 7.50832301e−28 |
| C59 | 8.67296427e−27 |
| C61 | 3.36303254e−26 |
| C63 | 8.34019597e−26 |
| C65 | −5.35649647e−25 |
| C67 | −8.65571939e−33 |
| C69 | −2.89230437e−30 |
| C71 | −2.73336712e−29 |
| C73 | −1.24809951e−28 |
| C75 | −3.2040601e−28 |
| C77 | −1.22368962e−27 |
| C78 | 1.04788846e−33 |
| C80 | −8.78177755e−33 |
| C82 | −1.19638938e−31 |
| C84 | −6.21594271e−31 |
| C86 | −2.38551896e−30 |
| C88 | −3.13914924e−30 |
| C90 | 3.19984707e−29 |
| C92 | 1.16289294e−37 |
| C94 | 2.62069946e−35 |
| C96 | 3.42335672e−34 |
| C98 | 1.84194813e−33 |
| C100 | 9.57587784e−33 |
| C102 | 3.03868144e−33 |
| C104 | 5.60304989e−32 |
| C105 | −2.13609687e−39 |
| C107 | 5.33232238e−38 |
| C109 | 9.59790795e−37 |
| C111 | 5.98820678e−36 |
| C113 | 2.69619845e−35 |
| C115 | 8.83369102e−35 |
| C117 | 1.42066402e−34 |
| C119 | −1.4409403e−33 |
| C121 | −1.26097283e−42 |
| C123 | −6.97372247e−41 |
| C125 | −1.30218358e−39 |
| C127 | −7.42449901e−39 |
| C129 | −5.35218027e−38 |
| C131 | −1.73751077e−37 |
| C133 | −1.69978425e−37 |
| C135 | −4.00667525e−37 |
| C136 | −9.25027199e−46 |
| C138 | −1.39746666e−43 |
| C140 | −2.84029421e−42 |
| C142 | −2.25579428e−41 |
| C144 | −1.00279788e−40 |
| C146 | −4.53773919e−40 |
| C148 | −1.58311764e−39 |
| C150 | −1.41999236e−39 |
| C152 | 2.17050522e−38 |

Table 4a for FIG. 2

| Surface | DCX | DCY | DCZ |
|---|---|---|---|
| Image | 0.00000000 | 0.00000000 | 0.00000000 |
| M10 | 0.00000000 | 0.00000000 | 682.54910274 |
| M9 | 0.00000000 | 249.43345277 | 145.29208466 |
| M8 | 0.00000000 | −220.05468953 | 1156.52693128 |
| M7 | 0.00000000 | −183.45583878 | 1395.16642311 |
| M6 | 0.00000000 | 243.45008686 | 1820.24509168 |
| Stop | 0.00000000 | 781.29871330 | 2029.56902646 |
| M5 | 0.00000000 | 1160.98299518 | 2177.33738349 |
| M4 | 0.00000000 | 1710.86880274 | 2173.71626521 |
| M3 | 0.00000000 | 2011.56754641 | 2067.19445324 |
| M2 | 0.00000000 | 2242.07573615 | 1840.71643886 |
| M1 | 0.00000000 | 2569.16681637 | 1103.33520507 |
| Object | 0.00000000 | 2361.06513202 | 2931.79406196 |

Table 4b for FIG. 2

| Surface | TLA[deg] | TLB[deg] | TLC[deg] |
|---|---|---|---|
| Image | −0.00000000 | 0.00000000 | −0.00000000 |
| M10 | 12.45206393 | 0.00000000 | −0.00000000 |
| M9 | 204.90412786 | −0.00000000 | −0.00000000 |
| M8 | 98.09246024 | 0.00000000 | −0.00000000 |
| M7 | 63.07895508 | 0.00000000 | −0.00000000 |
| M6 | 33.07124029 | −0.00000000 | 0.00000000 |
| Stop | −86.59033686 | −0.00000000 | 180.00000000 |
| M5 | 10.44403163 | −0.00000000 | −0.00000000 |
| M4 | −9.94193456 | −0.00000000 | −0.00000000 |
| M3 | −32.00064460 | −0.00000000 | −0.00000000 |
| M2 | −55.28668769 | −0.00000000 | 0.00000000 |
| M1 | 195.20719385 | −0.00000000 | −0.00000000 |
| Object | 11.49304323 | 0.00000000 | 0.00000000 |

Table 5 for FIG. 2

| Surface | Angle of incidence[deg] | Reflectivity |
|---|---|---|
| M10 | 12.45206393 | 0.64804869 |
| M9 | 0.00000000 | 0.66565840 |
| M8 | 73.18833238 | 0.77117192 |
| M7 | 71.79816246 | 0.74336573 |
| M6 | 78.19412274 | 0.85360560 |
| M5 | 79.17866859 | 0.86731610 |
| M4 | 80.43536522 | 0.88397599 |
| M3 | 77.50592474 | 0.84361983 |
| M2 | 79.20803217 | 0.86771549 |
| M1 | 8.71415063 | 0.65746288 |
| Overall transmission | | 0.0779 |

Table 6 for FIG. 2

| X[mm] | Y[mm] | Z[mm] |
|---|---|---|
| 0.00000000 | −26.28726367 | −0.63068162 |
| 31.69185598 | −26.09628851 | −1.53950183 |
| 62.64332842 | −25.51669909 | −4.18938979 |
| 92.12079882 | −24.53113873 | −8.35334657 |
| 119.40547685 | −23.11832594 | −13.66301694 |
| 143.80438508 | −21.26160430 | −19.62685072 |
| 164.66670456 | −18.95800828 | −25.66175785 |
| 181.40756151 | −16.22754881 | −31.14277456 |
| 193.53899715 | −13.12006877 | −35.47169919 |
| 200.70439461 | −9.71525276 | −38.15795403 |
| 202.70901570 | −6.11433110 | −38.89544770 |
| 199.53698197 | −2.42722099 | −37.61339305 |
| 191.34756415 | 1.23894609 | −34.48367665 |
| 178.45176595 | 4.78615349 | −29.88311471 |
| 161.27786082 | 8.12619947 | −24.32569197 |
| 140.33668518 | 11.17689805 | −18.38668998 |
| 116.19411687 | 13.85593322 | −12.63585690 |
| 89.45262946 | 16.07638154 | −7.58712638 |
| 60.74011192 | 17.74870904 | −3.66487194 |
| 30.70288782 | 18.79125679 | −1.18323036 |
| 0.00000000 | 19.14582736 | −0.33446470 |
| −30.70288782 | 18.79125679 | −1.18323036 |
| −60.74011192 | 17.74870904 | −3.66487194 |
| −89.45262946 | 16.07638154 | −7.58712638 |
| −116.19411687 | 13.85593322 | −12.63585690 |
| −140.33668518 | 11.17689805 | −18.38668998 |
| −161.27786082 | 8.12619947 | −24.32569197 |
| −178.45176595 | 4.78615349 | −29.88311471 |
| −191.34756415 | 1.23894609 | −34.48367665 |
| −199.53698197 | −2.42722099 | −37.61339305 |
| −202.70901570 | −6.11433110 | −38.89544770 |
| −200.70439461 | −9.71525276 | −38.15795403 |
| −193.53899715 | −13.12006877 | −35.47169919 |
| −181.40756151 | −16.22754881 | −31.14277456 |
| −164.66670456 | −18.95800828 | −25.66175785 |
| −143.80438508 | −21.26160430 | −19.62685072 |

-continued

Table 6 for FIG. 2

| X[mm] | Y[mm] | Z[mm] |
| --- | --- | --- |
| −119.40547685 | −23.11832594 | −13.66301694 |
| −92.12079882 | −24.53113873 | −8.35334657 |
| −62.64332842 | −25.51669909 | −4.18938979 |
| −31.69185598 | −26.09628851 | −1.53950183 |

Table 7 for FIG. 2

| X[mm] | Y[mm] | Z[mm] |
| --- | --- | --- |
| 0.00000000 | −4.58384652 | −0.01916625 |
| 6.23062250 | −4.53213351 | −0.05414911 |
| 12.30714552 | −4.37802319 | −0.15566608 |
| 18.07925857 | −4.12460516 | −0.31375494 |
| 23.40415256 | −3.77703638 | −0.51289064 |
| 28.15007563 | −3.34253897 | −0.73349935 |
| 32.19964733 | −2.83037255 | −0.95387719 |
| 35.45284073 | −2.25176240 | −1.15232970 |
| 37.82954084 | −1.61976608 | −1.30932093 |
| 39.27159199 | −0.94906620 | −1.40941462 |
| 39.74425946 | −0.25568401 | −1.44280696 |
| 39.23705170 | 0.44338340 | −1.40629081 |
| 37.76387678 | 1.13059187 | −1.30355222 |
| 35.36253789 | 1.78832901 | −1.14477294 |
| 32.09360239 | 2.39942334 | −0.94558797 |
| 28.03870421 | 2.94766255 | −0.72551494 |
| 23.29835626 | 3.41830005 | −0.50602285 |
| 17.98935804 | 3.79852921 | −0.30843758 |
| 12.24188376 | 4.07790588 | −0.15188880 |
| 6.19633084 | 4.24870102 | −0.05149000 |
| 0.00000000 | 4.30616654 | −0.01691445 |
| −6.19633084 | 4.24870102 | −0.05149000 |
| −12.24188376 | 4.07790588 | −0.15188880 |
| −17.98935804 | 3.79852921 | −0.30843758 |
| −23.29835626 | 3.41830005 | −0.50602285 |
| −28.03870421 | 2.94766255 | −0.72551494 |
| −32.09360239 | 2.39942334 | −0.94558797 |
| −35.36253789 | 1.78832901 | −1.14477294 |
| −37.76387678 | 1.13059187 | −1.30355222 |
| −39.23705170 | 0.44338340 | −1.40629081 |
| −39.74425946 | −0.25568401 | −1.44280696 |
| −39.27159199 | −0.94906620 | −1.40941462 |
| −37.82954084 | −1.61976608 | −1.30932093 |
| −35.45284073 | −2.25176240 | −1.15232970 |
| −32.19964733 | −2.83037255 | −0.95387719 |
| −28.15007563 | −3.34253897 | −0.73349935 |
| −23.40415256 | −3.77703638 | −0.51289064 |
| −18.07925857 | −4.12460516 | −0.31375494 |
| −12.30714552 | −4.37802319 | −0.15566608 |
| −6.23062250 | −4.53213351 | −0.05414911 |

FIG. 3 shows a sagittal view of the projection optical unit 7. In this view, the location of the first plane intermediate image 18 adjacent to the passage opening 17 in the last mirror M10 in the imaging light beam path of the projection optical unit 7 becomes clear.

The projection optical unit 7 has an image-side numerical aperture of 0.55. In an imaging light plane parallel to the xz-plane (sagittal view according to FIG. 3), the projection optical unit 7 has a reduction factor $\beta_x$ of 4.00. In the yz-plane perpendicular thereto (meridional plane according to FIG. 2), the projection optical unit 7 has a reduction factor $\beta_y$ of 8.00. An object-side chief ray angle is 5.1°. The chief rays 16 run in a divergent fashion from the object field 4 toward the first mirror M1 in the beam path of the projection optical unit 7. An entrance pupil of the projection optical unit 7 thus lies in the beam path of the imaging light 3 upstream of the object field 4. The chief ray angle denotes the angle of a chief ray of a central object field point with respect to a normal to the object plane 5.

A pupil obscuration of the projection optical unit 7 is 15% of the numerical aperture of the projection optical unit 7. Hence, a surface portion of $0.15^2$ of a pupil of the projection optical unit 7 is obscured. An object-image offset do's is approximately 2360 mm. The mirrors of the projection optical unit 7 can be accommodated in a parallelepiped having xyz-edge lengths of 797 mm×3048 mm×2115 mm.

The object plane 5 extends at an angle of 11.5° in relation to the image plane 9; i.e., it is tilted in relation to the image plane 9.

A working distance between the mirror M9 lying closest to the image plane at 9 and the image plane 9 is 97 mm.

A further embodiment of a projection optical unit 22, which can be used in the projection exposure apparatus 1 according to FIG. 1 instead of the projection optical unit 7, is explained in the following text on the basis of FIGS. 5 and 6. Components and functions which have already been explained above in the context of FIGS. 1 to 4 are denoted, where applicable, by the same reference signs and are not discussed again in detail.

The mirrors M1 to M10 are once again embodied as free-form surface mirrors for which the free-form surface equation (1) indicated above holds true.

Figure 9:
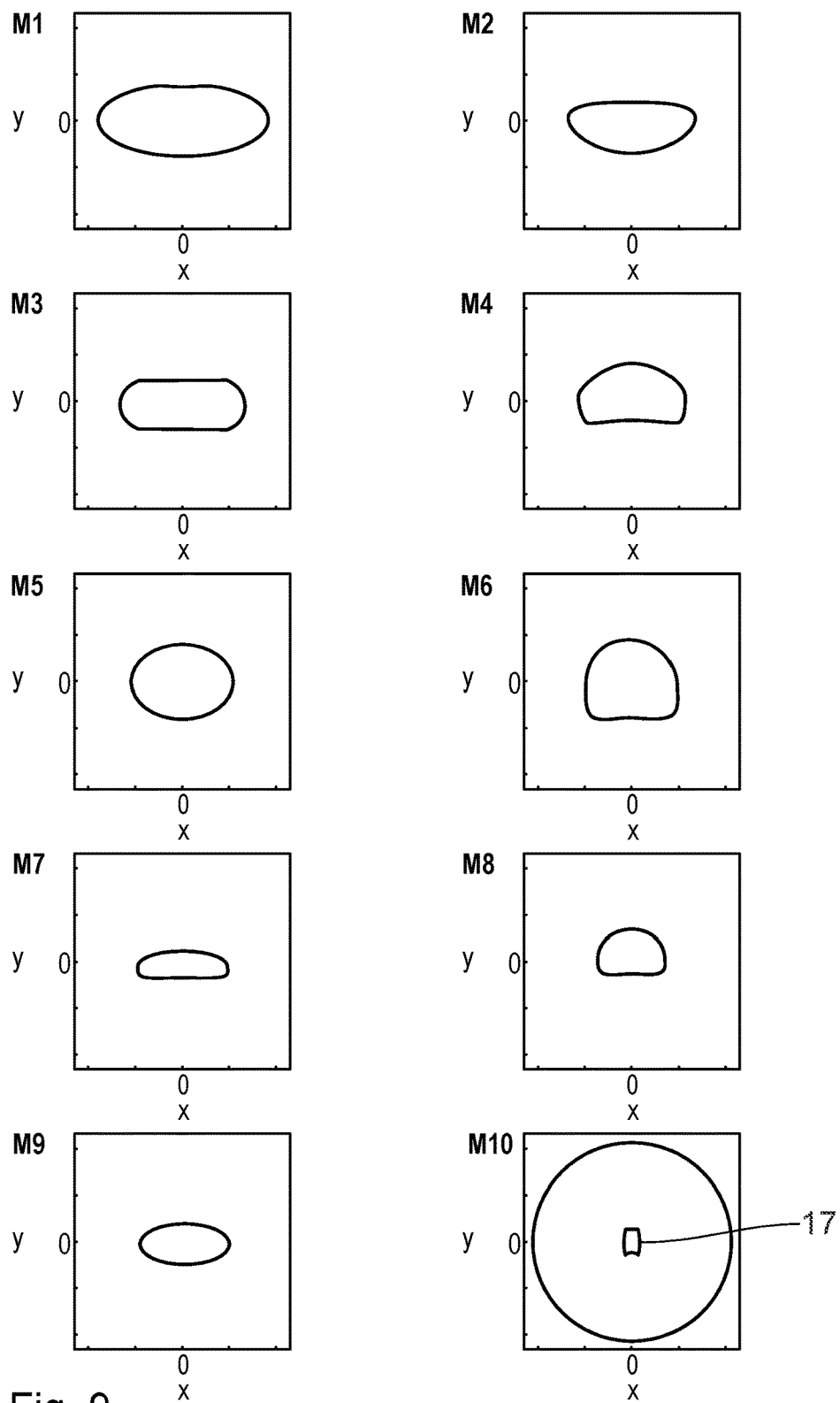
FIG. 9 shows plan views of marginal contours of optically used surfaces of the mirrors of the imaging optical unit according to FIG. 5.

FIG. 9 shows, once again, the marginal contours of the reflection surfaces in each case impinged upon by the imaging light 3 on the surfaces M1 to M10 of the projection optical unit 22, i.e. the footprints of the mirrors M1 to M10. The illustration of FIG. 9 corresponds to that of FIG. 4.

The following two tables once again show the mirror parameters of mirrors M1 to M10 of the projection optical unit 22.

| | M1 | M2 | M3 | M4 | M5 |
| --- | --- | --- | --- | --- | --- |
| Maximum angle of incidence [°] | 11.2 | 85.8 | 80.8 | 81.7 | 82.0 |
| Extent of the reflection surface in the x-direction [mm] | 680.3 | 529.4 | 494.0 | 453.7 | 402.2 |
| Extent of the reflection surface in the y-direction [mm] | 284.8 | 208.9 | 213.3 | 248.3 | 318.1 |
| Maximum mirror diameter [mm] | 680.4 | 529.4 | 495.1 | 457.7 | 406.9 |

| | M6 | M7 | M8 | M9 | M10 |
| --- | --- | --- | --- | --- | --- |
| Maximum angle of incidence [°] | 79.8 | 75.8 | 76.6 | 21.2 | 9.4 |
| Extent of the reflection surface in the x-direction [mm] | 379.1 | 372.0 | 294.5 | 358.8 | 850.5 |
| Extent of the reflection surface in the y-direction [mm] | 341.3 | 118.8 | 200.2 | 180.6 | 831.0 |
| Maximum mirror diameter [mm] | 420.4 | 372.0 | 294.5 | 358.8 | 850.8 |

The mirror M10 that predefines the image-side numerical aperture has the largest maximum mirror diameter, with a diameter of 850.8 mm. None of the other mirrors M1 to M9 has a maximum diameter that is greater than 700 mm. Eight of the ten mirrors, namely the mirrors M2 to M9, have a maximum mirror diameter that is less than 530 mm. Five of the ten mirrors, namely the mirrors M5 to M9, have a maximum mirror diameter that is less than 425 mm.

The optical design data from the projection optical unit 22 can be gathered from the following tables, which, in terms of their design, correspond to the tables for the projection optical unit 7 according to FIG. 2.

Figure 5:
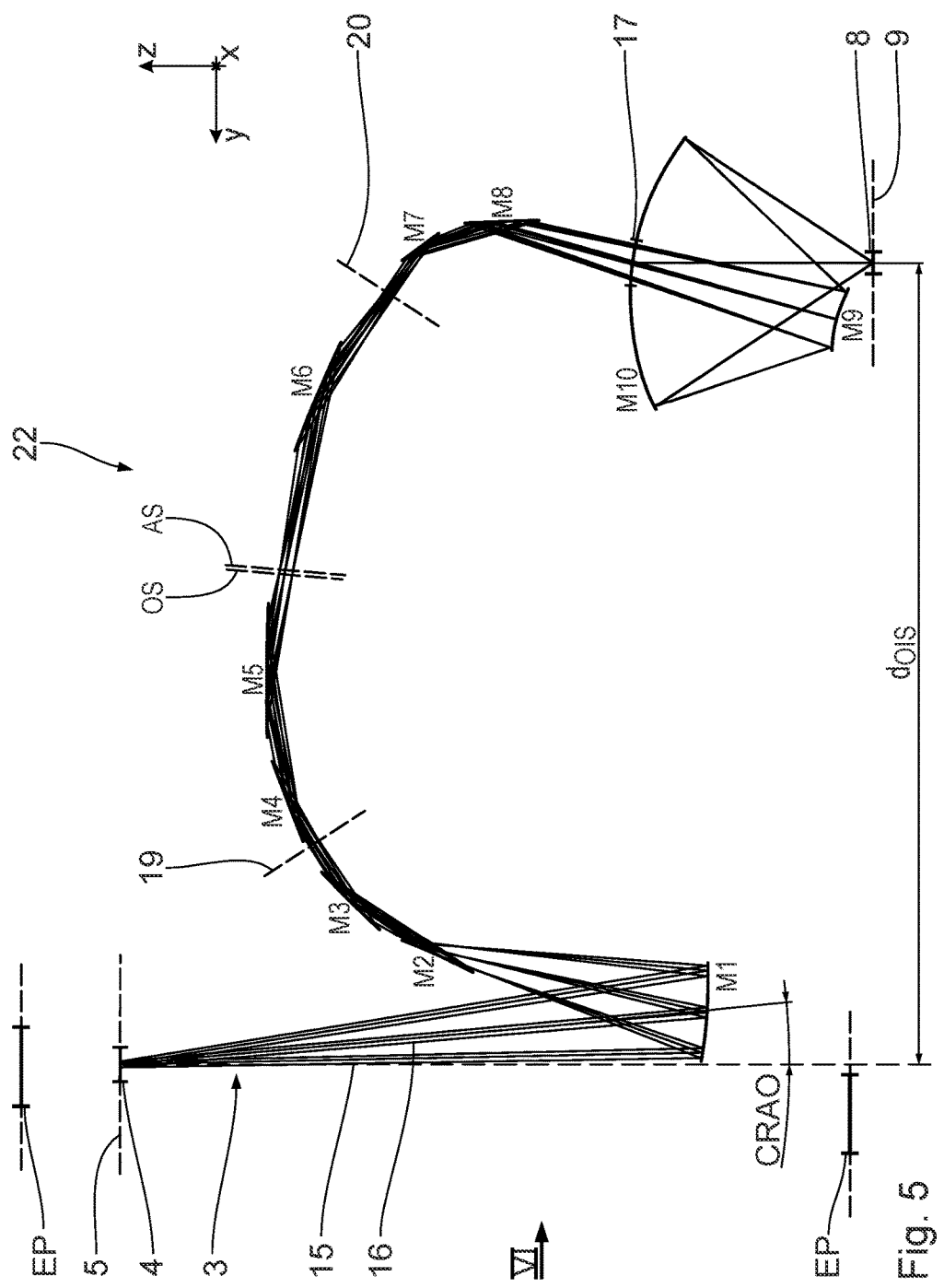
FIGS. 5 and 6 show, in illustrations similar to FIGS. 2 and 3, a further embodiment of an imaging optical unit, usable as a projection lens in the projection exposure apparatus according to FIG. 1.
Figure 6:
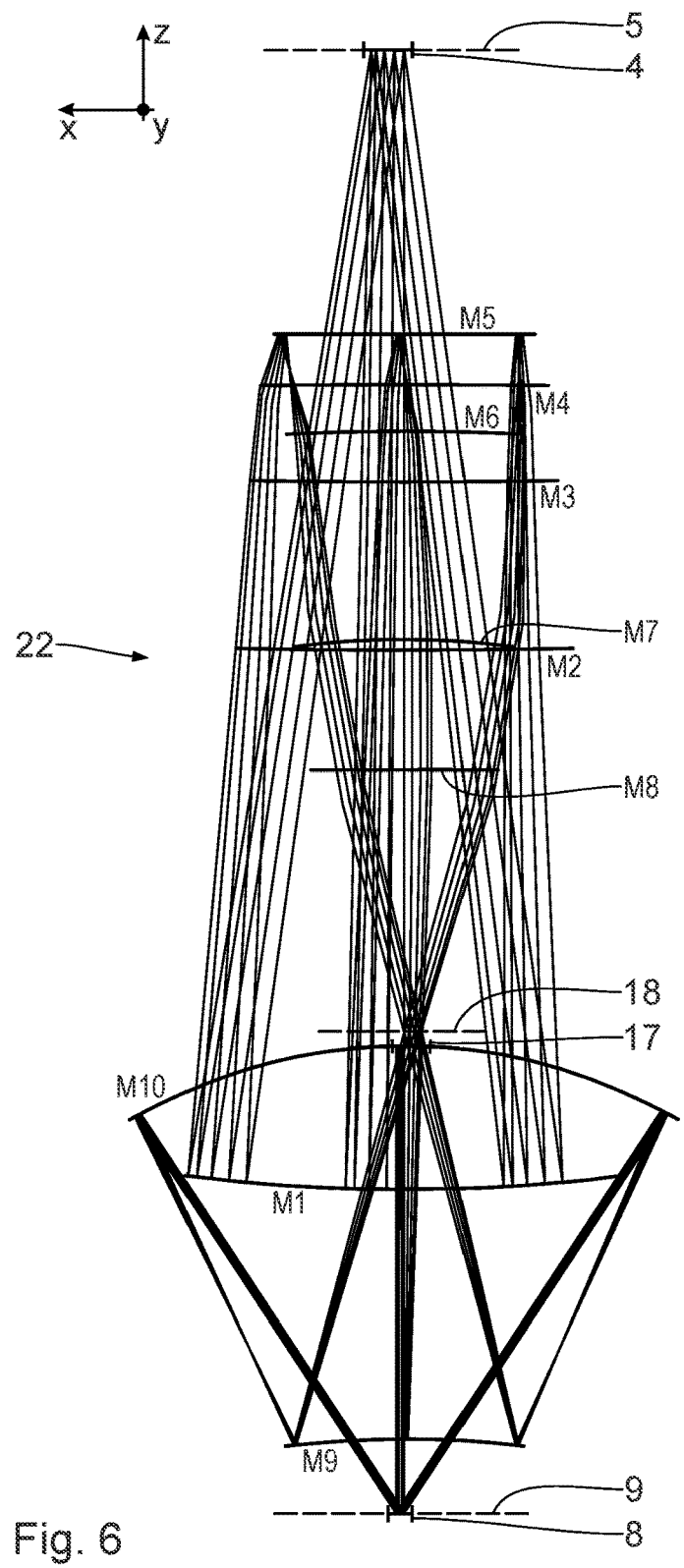

Table 1 for FIG. 5

| Exemplary embodiment | FIG. 5 |
|---|---|
| NA | 0.55 |
| Wavelength | 13.5 nm |
| beta_x | 4.0 |
| beta_y | −8.0 |
| Field dimension_x | 26.0 mm |
| Field dimension_y | 1.2 mm |
| Field curvature | −0.012345 1/mm |
| rms | 13.3 ml |
| Stops | AS, OS |

Table 2 for FIG. 5

| Surface | Radius_x[mm] | Power_x[1/mm] | Radius_y[mm] | Power_y[1/mm] | Operation |
|---|---|---|---|---|---|
| M10 | −869.3080100 | 0.0022797 | −778.5928237 | 0.0025924 | REFL |
| M9 | 2602.0496747 | −0.0007686 | 384.2214696 | −0.0052053 | REFL |
| M8 | −718.2470514 | 0.0008150 | 30510.8098846 | −0.0002239 | REFL |
| M7 | −752.1182438 | 0.0008331 | 16042.2750216 | −0.0003979 | REFL |
| M6 | −3270.4125599 | 0.0001298 | −3670.6088227 | 0.0025669 | REFL |
| M5 | −39785.3326866 | 0.0000091 | −5765.5741935 | 0.0019141 | REFL |
| M4 | −16034.7922775 | 0.0000233 | −10216.6190309 | 0.0010499 | REFL |
| M3 | 9574.6132714 | −0.0000436 | −3930.1905682 | 0.0024367 | REFL |
| M2 | 5696.9592961 | −0.0000643 | 1485.2462497 | −0.0073485 | REFL |
| M1 | −2733.3789956 | 0.0007228 | −1297.6261153 | 0.0015603 | REFL |

Table 3a for FIG. 5

| Coefficient | M10 | M9 | M8 |
|---|---|---|---|
| KY | 0.00000000 | 0.00000000 | 0.00000000 |
| KX | 0.00000000 | 0.00000000 | 0.00000000 |
| RX | −869.30801000 | 2602.04967500 | −718.24705150 |
| C7 | −3.50115108e−09 | −9.7790374e−07 | 6.28851853e−07 |
| C9 | −4.92545176e−09 | −1.07564728e−06 | 4.92758814e−08 |
| C10 | −1.56874319e−11 | 7.64407422e−10 | 1.46961089e−10 |
| C12 | −4.83471482e−11 | 4.1944661e−09 | −9.90784074e−10 |
| C14 | −1.4150121e−11 | 2.20249239e−09 | 5.26676904e−10 |
| C16 | −1.22638717e−14 | −1.6991744e−12 | −1.76931806e−13 |
| C18 | −1.82295329e−14 | −5.09302083e−12 | 1.63225989e−12 |
| C20 | −1.04417542e−14 | −4.99474166e−12 | 3.00741879e−12 |
| C21 | −3.14425027e−17 | 1.74605563e−15 | −6.95881583e−16 |
| C23 | −1.18753568e−16 | 1.51762355e−14 | 2.51525789e−15 |
| C25 | −1.1247438e−16 | 3.06218684e−14 | 2.2933979e−15 |
| C27 | −2.96708004e−17 | 4.99892752e−14 | 1.92742933e−14 |
| C29 | −1.93233858e−20 | −1.18614919e−17 | 1.08654612e−17 |
| C31 | −4.77737566e−20 | −5.71762455e−17 | −2.18043452e−18 |
| C33 | −4.65969274e−20 | −1.72770763e−16 | 4.0159214e−17 |
| C35 | −1.52531921e−20 | −6.29688126e−17 | 1.07460038e−16 |
| C36 | −4.9177484e−23 | 2.78158452e−21 | 8.64817602e−21 |
| C38 | −2.3529495e−22 | 9.90406032e−20 | −3.7077501e−20 |
| C40 | −3.67477654e−22 | 4.04108731e−19 | 1.90111998e−19 |
| C42 | −2.41658412e−22 | 9.13512927e−19 | 2.84898021e−19 |
| C44 | −5.28774981e−23 | 3.9970345e−20 | 4.28073704e−19 |
| C46 | −2.53619074e−26 | −5.52648347e−23 | −2.18242805e−23 |
| C48 | −9.35727071e−26 | −3.06649246e−22 | 8.15300946e−22 |
| C50 | −1.407507e−25 | −1.63453782e−21 | 1.45607087e−21 |
| C52 | −9.62763512e−26 | −1.19312316e−21 | −2.22879735e−23 |
| C54 | −3.38598262e−26 | −1.32098082e−20 | 5.29578348e−21 |
| C55 | −7.28461816e−29 | 1.63707168e−25 | −1.63052539e−25 |
| C57 | −3.89709184e−28 | 5.17135447e−25 | −8.23822216e−25 |
| C59 | −8.10206805e−28 | 1.79799522e−24 | −5.3386535e−24 |
| C61 | −8.06594025e−28 | −1.67157766e−24 | −2.63267781e−23 |
| C63 | −3.63229095e−28 | 1.85929763e−23 | 1.4978656e−23 |
| C65 | −6.94305626e−29 | 1.37596582e−22 | 1.60652574e−22 |
| C67 | −5.17390636e−32 | −4.73635713e−28 | −2.50723659e−27 |
| C69 | −2.76133587e−31 | −9.68441245e−27 | −3.18583903e−26 |
| C71 | −5.75470516e−31 | −6.55981608e−26 | −1.33755802e−25 |
| C73 | −5.37198691e−31 | −2.14552978e−25 | −4.67020493e−26 |
| C75 | −2.15218576e−31 | −1.77890928e−25 | 1.60245075e−24 |
| C77 | 2.61002136e−32 | 2.52802452e−24 | 2.4414866e−24 |
| C78 | −1.33351127e−34 | −3.40975628e−30 | 5.11409407e−30 |
| C80 | −1.0054419e−33 | 8.63348315e−30 | 7.37254112e−29 |

Table 3a for FIG. 5

| Coefficient | M10 | M9 | M8 |
|---|---|---|---|
| C82 | −2.92630151e−33 | 1.48899099e−28 | 3.49120412e−29 |
| C84 | −4.57056217e−33 | 1.03301246e−27 | 1.71797008e−27 |
| C86 | −4.09582323e−33 | 3.39897352e−27 | 1.12084792e−26 |
| C88 | −2.04237423e−33 | −4.15113593e−27 | 2.61828937e−26 |
| C90 | −3.57674802e−34 | −2.2979605e−26 | 1.89501924e−26 |
| C92 | 6.41185373e−39 | 4.74563151e−33 | 6.71528349e−32 |
| C94 | 1.76112217e−37 | 1.45876695e−31 | 8.28287721e−31 |
| C96 | 5.5411331e−37 | 1.42275073e−30 | 6.82286679e−30 |
| C98 | 8.68097577e−37 | 9.13558631e−30 | 4.30994562e−29 |
| C100 | 3.42223873e−37 | 3.51677458e−29 | 1.32672418e−28 |
| C102 | −7.04829093e−38 | 4.95216183e−29 | 1.65234363e−28 |
| C104 | −1.81548666e−37 | −1.5700553e−28 | 7.44056128e−29 |
| C105 | 1.55137664e−40 | 4.41526468e−35 | −8.48895624e−35 |
| C107 | 5.82808475e−40 | −1.23424716e−34 | −1.6612053e−33 |
| C109 | 2.44087528e−39 | −3.19549581e−33 | 5.55352481e−33 |
| C111 | 5.93840503e−39 | −3.09982368e−32 | 4.5754064e−32 |
| C113 | 8.8212298e−39 | −1.72638685e−31 | 2.02996025e−31 |
| C115 | 8.63860896e−39 | −4.69214518e−31 | 4.39727396e−31 |
| C117 | 5.12960062e−39 | 1.36535167e−31 | 3.69770347e−31 |
| C119 | 1.0702848e−39 | 1.55656455e−30 | 1.18279441e−31 |
| C121 | −3.06949325e−43 | −8.94064247e−38 | 0 |
| C123 | −2.18028671e−42 | −2.46553946e−36 | 0 |
| C125 | −6.86344939e−42 | −2.34166186e−35 | 0 |
| C127 | −1.22750442e−41 | −1.49148863e−34 | 0 |
| C129 | −1.25985922e−41 | −6.69544608e−34 | 0 |
| C131 | −6.60294366e−42 | −2.18823933e−33 | 0 |
| C133 | −1.87633758e−42 | −3.84766887e−33 | 0 |
| C135 | −1.60470913e−43 | 2.36306182e−33 | 0 |
| C136 | −8.76656405e−46 | −1.96833702e−40 | 0 |
| C138 | −6.55036406e−45 | 1.86248388e−39 | 0 |
| C140 | −2.70449789e−44 | 4.46630844e−38 | 0 |
| C142 | −6.29281844e−44 | 4.28810046e−37 | 0 |
| C144 | −9.0993377e−44 | 2.74468914e−36 | 0 |
| C146 | −8.52048374e−44 | 1.13033506e−35 | 0 |
| C148 | −5.26001056e−44 | 2.65031009e−35 | 0 |
| C150 | −2.06603634e−44 | 1.59603141e−35 | 0 |
| C152 | −3.67734069e−45 | −2.36167036e−35 | 0 |

Table 3b for FIG. 5

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −752.11824380 | −3270.41256000 | −39785.33269000 |
| C7 | −3.70935649e−07 | 1.14204884e−07 | −6.97621412e−08 |
| C9 | 5.18161693e−07 | −2.58530033e−08 | 1.64595109e−07 |
| C10 | 1.80413353e−10 | −1.14685523e−10 | 3.9764206e−10 |
| C12 | −1.45283618e−09 | −4.06990977e−11 | 9.23529251e−11 |
| C14 | 1.9262961e−09 | −1.07013295e−10 | 4.76744117e−12 |
| C16 | 1.00096242e−12 | −2.00016603e−14 | −2.76247582e−14 |
| C18 | −1.13644156e−11 | 2.28346094e−13 | 2.0990975e−13 |
| C20 | 1.28051975e−11 | 3.41794261e−14 | 6.73454787e−13 |
| C21 | 8.3715012e−17 | 2.98259863e−16 | 3.50187845e−16 |
| C23 | 1.77779173e−14 | −2.04228461e−16 | 5.46941646e−16 |
| C25 | −5.64470665e−14 | −5.08222775e−16 | 4.10735525e−16 |
| C27 | −1.43209502e−14 | −1.69707722e−16 | 1.32927647e−15 |
| C29 | −1.11998186e−17 | −2.61830238e−19 | −1.03955351e−18 |
| C31 | 1.05022686e−18 | 1.30229376e−18 | 6.21046279e−19 |
| C33 | 2.95463553e−18 | 7.79927697e−19 | 1.93127092e−18 |
| C35 | 2.14030511e−16 | 4.60656386e−19 | 3.560526e−18 |
| C36 | 2.44510815e−21 | 1.01255465e−22 | 5.36113636e−21 |
| C38 | −8.10017031e−20 | −1.09878129e−21 | 4.88286477e−21 |
| C40 | 1.1541444e−19 | −3.86591836e−21 | 5.01325612e−21 |
| C42 | 5.82969588e−19 | −4.75815597e−21 | 1.61685259e−20 |
| C44 | 3.82357565e−18 | 3.34054543e−22 | 1.57036302e−20 |
| C46 | 3.67742759e−22 | 3.42907869e−24 | −1.66098704e−23 |
| C48 | 6.05641891e−23 | 1.04056835e−23 | 1.06940695e−23 |
| C50 | −2.94108386e−21 | 1.73293359e−23 | −3.20443027e−23 |
| C52 | −6.59269155e−20 | 3.7771892e−24 | 2.26337849e−23 |
| C54 | −6.05261138e−20 | −2.31850349e−24 | 4.27395429e−23 |
| C55 | −3.07155576e−26 | 1.08429738e−25 | −5.7022116e−26 |

Table 3b for FIG. 5

| Coefficient | M7 | M6 | M5 |
| --- | --- | --- | --- |
| C57 | −3.72656739e−25 | −2.23882015e−27 | −2.18952932e−26 |
| C59 | −8.63020098e−24 | −5.2563985e−26 | 1.42738106e−26 |
| C61 | 1.37802616e−22 | −2.03526409e−26 | −1.3400957e−25 |
| C63 | 2.67412096e−22 | 4.44652791e−26 | −2.11929073e−25 |
| C65 | 1.83670311e−23 | −2.65638153e−27 | −3.61780494e−25 |
| C67 | 2.01045404e−28 | 1.16463062e−28 | −9.62937695e−29 |
| C69 | 4.23996647e−27 | 1.69101472e−28 | −1.66256514e−28 |
| C71 | −1.12510374e−25 | −2.4234926e−29 | 6.82413726e−28 |
| C73 | 1.2655875e−24 | −1.14315405e−28 | 2.05563097e−27 |
| C75 | 1.15062152e−23 | −2.14241103e−28 | −8.81664434e−28 |
| C77 | 1.49164327e−23 | 2.42309874e−28 | −6.98448231e−28 |
| C78 | 5.09922795e−31 | −2.70326053e−30 | 1.63047582e−30 |
| C80 | 8.13481643e−30 | −5.19309314e−31 | −2.55061914e−31 |
| C82 | 7.20263484e−28 | −1.40971342e−31 | −7.88723541e−31 |
| C84 | −1.41044744e−27 | 1.31966847e−30 | 6.65035053e−30 |
| C86 | −4.27948507e−26 | −1.78133453e−31 | 1.98171259e−29 |
| C88 | −2.33726115e−25 | −2.19627873e−30 | 1.4940962e−29 |
| C90 | −1.60918106e−25 | 5.71949542e−31 | 2.50340365e−29 |
| C92 | −9.92597124e−33 | −2.06384653e−33 | 1.7958732e−33 |
| C94 | −6.80777127e−31 | −2.32035657e−33 | 1.19993647e−33 |
| C96 | −7.95434859e−30 | −4.83315819e−34 | −4.72101252e−33 |
| C98 | 3.68480874e−29 | 3.74828503e−33 | −3.45232856e−32 |
| C100 | 3.69646028e−28 | 4.72979312e−34 | −4.98195809e−32 |
| C102 | 1.8079515e−27 | 4.97237132e−33 | 6.06049519e−32 |
| C104 | 1.73878827e−28 | −4.10351172e−33 | 6.76934322e−32 |
| C105 | −2.4962474e−37 | 1.85872349e−35 | −1.55540897e−35 |
| C107 | 2.68999959e−34 | 5.30576886e−36 | 5.9762438e−36 |
| C109 | 2.55096101e−33 | 1.36308121e−35 | 1.14874935e−35 |
| C111 | 4.70398078e−32 | −3.18539277e−35 | −3.45968317e−35 |
| C113 | −3.65950224e−31 | 4.08064679e−36 | −3.57260831e−34 |
| C115 | −2.69573984e−31 | −1.49121892e−35 | −4.50161712e−34 |
| C117 | −7.25231228e−30 | 3.57447477e−35 | −1.64662987e−34 |
| C119 | 5.11134204e−30 | −1.46095543e−35 | −1.98834381e−34 |

Table 3c for FIG. 5

| Coefficient | M4 | M3 | M2 |
| --- | --- | --- | --- |
| KY | 0.00000000 | 0.00000000 | 0.00000000 |
| KX | 0.00000000 | 0.00000000 | 0.00000000 |
| RX | −16034.79228000 | 9574.61327100 | 5696.95929600 |
| C7 | 6.03925095e−09 | 3.26239122e−08 | 1.59791032e−09 |
| C9 | −6.94662012e−09 | −2.27145809e−07 | −1.40795422e−06 |
| C10 | 5.54884567e−11 | 7.60877141e−11 | 2.24741119e−11 |
| C12 | 2.52583724e−11 | 1.46695947e−10 | −7.62544795e−11 |
| C14 | −2.15044807e−10 | −2.96089016e−10 | 5.24306931e−09 |
| C16 | −1.9407843e−13 | −1.10665551e−13 | 4.41314287e−13 |
| C18 | 1.78662307e−13 | −5.57607359e−14 | 2.4313786e−12 |
| C20 | −2.16511379e−13 | −2.02465861e−12 | −1.61840093e−11 |
| C21 | −4.1439186e−16 | 5.95471784e−17 | 1.65281042e−16 |
| C23 | 9.4251442e−17 | −1.12423275e−16 | −2.11123946e−15 |
| C25 | 2.60263465e−17 | 1.73026522e−15 | −1.45428371e−14 |
| C27 | −2.55509799e−15 | −7.08053399e−16 | 3.46493571e−14 |
| C29 | 5.29272828e−19 | −5.40817519e−20 | −7.55616992e−19 |
| C31 | −6.91917763e−19 | −1.61040978e−18 | 3.77666807e−18 |
| C33 | 2.85395117e−18 | −4.13936099e−18 | 6.33486623e−17 |
| C35 | −4.96927209e−18 | −3.49881437e−17 | 3.46409803e−17 |
| C36 | 6.83763591e−22 | −7.57909981e−22 | 2.95766307e−22 |
| C38 | −2.13234959e−21 | 3.48854016e−21 | 4.95952942e−21 |
| C40 | 7.22731509e−21 | −7.38743374e−22 | 5.0046765e−20 |
| C42 | 2.09286651e−20 | 4.404165504e−20 | −1.3911305e−19 |
| C44 | −5.85604547e−20 | 3.74858983e−20 | −9.88543639e−19 |
| C46 | 6.43248577e−24 | 9.63273701e−24 | 4.88317263e−24 |
| C48 | −1.58441497e−25 | −7.55811815e−24 | −4.2542718e−23 |
| C50 | −1.56411013e−24 | −1.94301035e−23 | −7.65586872e−22 |
| C52 | −2.19059644e−23 | −1.39352362e−22 | −8.37467611e−22 |
| C54 | −3.01080627e−22 | −1.62085554e−22 | 5.43128229e−21 |
| C55 | −4.31558591e−26 | 1.30815384e−27 | 7.93299714e−27 |
| C57 | 3.18795075e−26 | −4.60436614e−26 | −8.0344969e−28 |
| C59 | −1.45255838e−25 | 3.00241314e−26 | 2.98448401e−26 |
| C61 | −5.17891518e−25 | −1.07582737e−25 | 6.21693076e−24 |
| C63 | −9.52938201e−25 | 1.35257242e−24 | 1.79376848e−23 |

Table 3c for FIG. 5

| Coefficient | M4 | M3 | M2 |
|---|---|---|---|
| C65 | −3.92684321e−25 | 1.42144281e−25 | 6.20066641e−23 |
| C67 | −1.14006341e−28 | −6.10553014e−29 | −4.8721203e−29 |
| C69 | −1.3403719e−28 | 1.78125834e−28 | 2.57661074e−28 |
| C71 | −3.59493083e−28 | −4.52829735e−28 | 3.53707362e−27 |
| C73 | 1.60006756e−27 | −9.51584504e−28 | −3.93778871e−26 |
| C75 | 8.12793081e−27 | −1.49319185e−26 | −1.39599626e−25 |
| C77 | 6.05291213e−27 | −5.94534387e−26 | −1.70087313e−24 |
| C78 | 4.68845287e−31 | 1.1876792e−32 | −8.867378e−32 |
| C80 | 3.62849118e−31 | 1.22291807e−31 | 3.97705432e−32 |
| C82 | 2.8946197e−30 | −2.0159866e−33 | −2.92658857e−31 |
| C84 | 1.05806179e−29 | 4.14509233e−30 | −1.9866676e−29 |
| C86 | 3.90741277e−29 | 2.17039478e−29 | 9.23876488e−29 |
| C88 | 6.77151397e−29 | 8.29600294e−29 | −1.42395946e−28 |
| C90 | −5.19333773e−29 | 3.55804272e−28 | 1.58363793e−26 |
| C92 | 6.48128342e−34 | 4.76107907e−35 | 1.4337662e−34 |
| C94 | 8.09440725e−34 | −1.27977811e−33 | −1.98985191e−33 |
| C96 | 3.72660414e−34 | 4.63315852e−34 | −1.97598786e−32 |
| C98 | −2.0200799e−34 | 9.06913701e−33 | 1.78724463e−31 |
| C100 | −1.37280642e−31 | −2.20197055e−31 | 1.38421441e−30 |
| C102 | −6.74863143e−32 | 1.11311398e−31 | 7.2961796e−30 |
| C104 | −5.77905012e−31 | −1.65281364e−31 | −6.93095163e−29 |
| C105 | −1.51737981e−36 | 1.31694944e−37 | 2.35455933e−37 |
| C107 | −5.04387069e−36 | 8.86231792e−37 | 4.22965359e−37 |
| C109 | −1.65804642e−35 | 2.46082309e−36 | 7.14026917e−36 |
| C111 | −9.58931818e−35 | −2.70484671e−35 | 1.548961e−35 |
| C113 | −1.42091054e−34 | −4.49614897e−35 | −1.39836488e−33 |
| C115 | −1.01035364e−33 | 6.52656741e−34 | −7.91692777e−33 |
| C117 | −8.16033736e−34 | −1.24041683e−33 | −2.56592926e−32 |
| C119 | −1.3759859e−33 | −3.94755303e−33 | 1.19798385e−31 |

Table 3d for FIG. 5

| Coefficient | M1 |
|---|---|
| KY | 0.00000000 |
| KX | 0.00000000 |
| RX | −2733.37899600 |
| C7 | −1.07227904e−08 |
| C9 | 2.08293311e−08 |
| C10 | −4.23699194e−12 |
| C12 | −9.10151978e−13 |
| C14 | −9.57929038e−11 |
| C16 | 1.00115091e−14 |
| C18 | −2.28938701e−14 |
| C20 | 6.5030622e−14 |
| C21 | −2.44883504e−18 |
| C23 | 1.95331906e−17 |
| C25 | 3.53111902e−17 |
| C27 | −6.39800102e−16 |
| C29 | −3.21472327e−21 |
| C31 | 4.15965877e−20 |
| C33 | −2.58607064e−19 |
| C35 | 3.80225246e−19 |
| C36 | 1.2674299e−24 |
| C38 | −9.81796216e−25 |
| C40 | −2.01060919e−22 |
| C42 | −9.42925968e−22 |
| C44 | −4.11392945e−21 |
| C46 | 5.46178217e−26 |
| C48 | 6.20216864e−26 |
| C50 | 2.14560789e−24 |
| C52 | 8.83279357e−24 |
| C54 | 6.68083614e−23 |
| C55 | −6.06665142e−29 |
| C57 | 6.72747508e−28 |
| C59 | 9.174949e−27 |
| C61 | 5.18881245e−26 |
| C63 | 2.18172279e−25 |
| C65 | −1.60516545e−25 |
| C67 | −5.07419186e−31 |
| C69 | −6.7941363e−31 |
| C71 | −1.74665297e−29 |
| C73 | −2.26352087e−28 |
| C75 | −1.56132886e−27 |
| C77 | −5.75078714e−27 |
| C78 | 4.80076165e−34 |
| C80 | −9.70304619e−33 |
| C82 | −1.40701044e−31 |
| C84 | −7.97696523e−31 |
| C86 | −4.88432697e−30 |
| C88 | −1.79588468e−29 |
| C90 | 1.6486908e−29 |
| C92 | 2.48841996e−36 |
| C94 | 5.84056891e−36 |
| C96 | 1.86712201e−34 |
| C98 | 2.27321062e−33 |
| C100 | 1.73055737e−32 |
| C102 | 9.02658619e−32 |
| C104 | 2.13388526e−31 |
| C105 | −1.40276955e−39 |
| C107 | 6.6231595e−38 |
| C109 | 1.24643269e−36 |
| C111 | 7.52164967e−36 |
| C113 | 4.07853266e−35 |
| C115 | 2.69022864e−34 |
| C117 | 7.8624425e−34 |
| C119 | −5.86612928e−34 |
| C121 | −6.36706031e−42 |
| C123 | −8.27274432e−42 |
| C125 | −5.76519274e−40 |
| C127 | −8.11565956e−39 |
| C129 | −7.13938807e−38 |
| C131 | −4.17623634e−37 |
| C133 | −1.90619557e−36 |
| C135 | −2.82473216e−36 |
| C136 | 1.11197415e−45 |
| C138 | −1.81264814e−43 |
| C140 | −4.08868567e−42 |
| C142 | −2.96820411e−41 |

Table 3d for FIG. 5

| Coefficient | M1 |
| --- | --- |
| C144 | −1.30720619e−40 |
| C146 | −9.2106426e−40 |
| C148 | −5.73880943e−39 |
| C150 | −1.35075947e−38 |
| C152 | 3.90453273e−39 |

Table 4a for FIG. 5

| Surface | DCX | DCY | DCZ |
| --- | --- | --- | --- |
| Image | 0.00000000 | 0.00000000 | 0.00000000 |
| M10 | 0.00000000 | 0.00000000 | 736.26370956 |
| M9 | 0.00000000 | 171.11999157 | 118.44136653 |
| M8 | 0.00000000 | −120.56531282 | 1171.56027175 |
| M7 | 0.00000000 | −51.50722742 | 1377.26292259 |
| M6 | 0.00000000 | 418.44349985 | 1705.41220513 |
| Aperture | 0.00000000 | 942.11125520 | 1801.65858675 |
| Obscuration | 0.00000000 | 955.76819944 | 1804.16863526 |
| M5 | 0.00000000 | 1250.61134458 | 1858.35869294 |
| M4 | 0.00000000 | 1681.77019009 | 1778.69965982 |
| M3 | 0.00000000 | 1928.54516765 | 1624.74280671 |
| M2 | 0.00000000 | 2106.37111455 | 1360.43276702 |
| M1 | 0.00000000 | 2299.77363692 | 510.18493472 |
| Object | −0.00000000 | 2459.22890232 | 2306.49401564 |

Table 4b for FIG. 5

| Surface | TLA[deg] | TLB[deg] | TLC[deg] |
| --- | --- | --- | --- |
| Image plane | −0.00000000 | 0.00000000 | −0.00000000 |
| M10 | 7.74064239 | 0.00000000 | −0.00000000 |
| M9 | 195.48128477 | 0.00000000 | −0.00000000 |
| M8 | 88.46172756 | 0.00000000 | −0.00000000 |
| M7 | 53.18367431 | 0.00000000 | −0.00000000 |
| M6 | 22.66975270 | −0.00000000 | −0.00000000 |
| Aperture stop | −85.31587976 | 0.00000000 | 180.00000000 |
| Obscuration stop | −85.31587976 | 0.00000000 | 180.00000000 |
| M5 | −0.02667676 | 0.00000000 | −0.00000000 |
| M4 | −21.21335393 | 0.00000000 | 0.00000000 |
| M3 | −44.01331845 | 0.00000000 | −0.00000000 |
| M2 | −66.62640557 | 0.00000000 | −0.00000000 |
| M1 | 183.87102353 | 0.00000000 | −0.00000000 |
| Object plane | −0.07275151 | −0.00000000 | −0.00000000 |

Table 5 for FIG. 5

| Surface | Angle of incidence[deg] | Reflectivity |
| --- | --- | --- |
| M10 | 7.74064239 | 0.65927620 |
| M9 | 0.00000085 | 0.66565840 |
| M8 | 72.98044279 | 0.76717179 |
| M7 | 71.74150395 | 0.74217796 |
| M6 | 77.74457445 | 0.84712279 |
| M5 | 79.55899609 | 0.87244962 |
| M4 | 79.25432675 | 0.86834411 |
| M3 | 77.94570873 | 0.85004161 |
| M2 | 79.44120415 | 0.87086874 |
| M1 | 8.94377505 | 0.65699903 |
| Overall transmission | | 0.0780 |

Table 6 for FIG. 5

| X[mm] | Y[mm] | Z[mm] |
| --- | --- | --- |
| 0.00000000 | −23.91268651 | 0.00000000 |
| 28.15240990 | −23.51768030 | 0.00000000 |
| 55.65557495 | −22.34769704 | 0.00000000 |
| 81.86338464 | −20.44910675 | 0.00000000 |
| 106.13929647 | −17.90216625 | 0.00000000 |
| 127.86860425 | −14.82214737 | 0.00000000 |
| 146.47747850 | −11.35686145 | 0.00000000 |
| 161.45701986 | −7.67867553 | 0.00000000 |
| 172.38882631 | −3.96936217 | 0.00000000 |
| 178.96836847 | −0.39914512 | 0.00000000 |
| 181.02225711 | 2.89452566 | 0.00000000 |
| 178.51592945 | 5.82123520 | 0.00000000 |
| 171.55051707 | 8.34014086 | 0.00000000 |
| 160.35054676 | 10.45133739 | 0.00000000 |
| 145.24617053 | 12.18109803 | 0.00000000 |
| 126.65406517 | 13.56709448 | 0.00000000 |
| 105.05980452 | 14.64754450 | 0.00000000 |
| 81.00272585 | 15.45516132 | 0.00000000 |
| 55.06326567 | 16.01491224 | 0.00000000 |
| 27.85208983 | 16.34401649 | 0.00000000 |
| 0.00000000 | 16.45259694 | 0.00000000 |
| −27.85208983 | 16.34401649 | 0.00000000 |
| −55.06326567 | 16.01491224 | 0.00000000 |
| −81.00272585 | 15.45516132 | 0.00000000 |
| −105.05980452 | 14.64754450 | 0.00000000 |
| −126.65406517 | 13.56709448 | 0.00000000 |
| −145.24617053 | 12.18109803 | 0.00000000 |
| −160.35054676 | 10.45133739 | 0.00000000 |
| −171.55051707 | 8.34014086 | 0.00000000 |
| −178.51592945 | 5.82123520 | 0.00000000 |
| −181.02225711 | 2.89452566 | 0.00000000 |
| −178.96836847 | −0.39914512 | 0.00000000 |
| −172.38882631 | −3.96936217 | 0.00000000 |
| −161.45701986 | −7.67867553 | 0.00000000 |
| −146.47747850 | −11.35686145 | 0.00000000 |
| −127.86860425 | −14.82214737 | 0.00000000 |
| −106.13929647 | −17.90216625 | 0.00000000 |
| −81.86338464 | −20.44910675 | 0.00000000 |
| −55.65557495 | −22.34769704 | 0.00000000 |
| −28.15240990 | −23.51768030 | 0.00000000 |

Table 7 for FIG. 5

| X[mm] | Y[mm] | Z[mm] |
| --- | --- | --- |
| 0.00000000 | −4.07043789 | 0.00000000 |
| 5.60146126 | −4.01626891 | 0.00000000 |
| 11.06508716 | −3.85552494 | 0.00000000 |
| 16.25637662 | −3.59341100 | 0.00000000 |
| 21.04743296 | −3.23832743 | 0.00000000 |
| 25.32010236 | −2.80147608 | 0.00000000 |
| 28.96890832 | −2.29634491 | 0.00000000 |
| 31.90370527 | −1.73810573 | 0.00000000 |
| 34.05197286 | −1.14296657 | 0.00000000 |
| 35.36067635 | −0.52752353 | 0.00000000 |
| 35.79762848 | 0.09184447 | 0.00000000 |
| 35.35230450 | 0.69950082 | 0.00000000 |
| 34.03608300 | 1.28097002 | 0.00000000 |
| 31.88190835 | 1.82323721 | 0.00000000 |
| 28.94339353 | 2.31492925 | 0.00000000 |
| 25.29340158 | 2.74639050 | 0.00000000 |
| 21.02215983 | 3.10967498 | 0.00000000 |
| 16.23497071 | 3.39848119 | 0.00000000 |
| 11.04958831 | 3.60805664 | 0.00000000 |
| 5.59333108 | 3.73509655 | 0.00000000 |
| 0.00000000 | 3.77765693 | 0.00000000 |
| −5.59333108 | 3.73509655 | 0.00000000 |
| −11.04958831 | 3.60805664 | 0.00000000 |
| −16.23497071 | 3.39848119 | 0.00000000 |
| −21.02215983 | 3.10967498 | 0.00000000 |
| −25.29340158 | 2.74639050 | 0.00000000 |
| −28.94339353 | 2.31492925 | 0.00000000 |
| −31.88190835 | 1.82323721 | 0.00000000 |

-continued

Table 7 for FIG. 5

| X[mm] | Y[mm] | Z[mm] |
|---|---|---|
| −34.03608300 | 1.28097002 | 0.00000000 |
| −35.35230450 | 0.69950082 | 0.00000000 |
| −35.79762848 | 0.09184447 | 0.00000000 |
| −35.36067635 | −0.52752353 | 0.00000000 |
| −34.05197286 | −1.14296657 | 0.00000000 |
| −31.90370527 | −1.73810573 | 0.00000000 |
| −28.96890832 | −2.29634491 | 0.00000000 |
| −25.32010236 | −2.80147608 | 0.00000000 |
| −21.04743296 | −3.23832743 | 0.00000000 |
| −16.25637662 | −3.59341100 | 0.00000000 |
| −11.06508716 | −3.85552494 | 0.00000000 |
| −5.60146126 | −4.01626891 | 0.00000000 |

An overall reflectivity of the projection optical unit 22 is approximately 7.8%.

A wavefront aberration rms is 13.3 mλ.

The projection optical unit 22 has an image-side numerical aperture of 0.55. In an imaging light plane parallel to the xz-plane, the projection optical unit 22 has a reduction factor $\beta_x$ of 4.00. In the yz-plane perpendicular thereto, the projection optical unit 22 has a reduction factor $\beta_y$ of 8.00. An object-side chief ray angle is 5.1°. The chief rays 16 run in a divergent fashion from the object field 4 toward the first mirror M1 in the beam path of the projection optical unit 22. An entrance pupil of the projection optical unit 22 thus lies in the beam path of the imaging light 3 upstream of the object field 4. A pupil obscuration of the projection optical unit 22 is 14% of the numerical aperture of the projection optical unit 22. Hence, a surface portion of $0.14^2$ of a pupil of the projection optical unit 22 is obscured. An object-image offset do's is approximately 2460 mm. The mirrors of the projection optical unit 22 can be accommodated in a parallelepiped having xyz-edge lengths of 850 mm×2823 mm×1774 mm.

In the projection optical unit 22, the object plane 5 extends at an angle of 0.1° in relation to the image plane 9.

A working distance between the mirror M9 lying closest to the image plane 9 and the image plane 9 is 85 mm.

Figure 7:
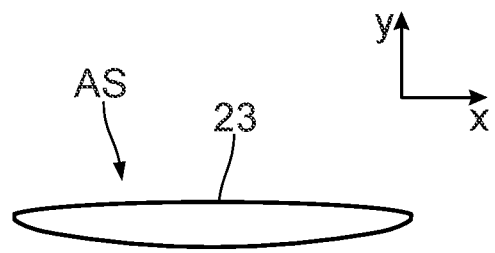
FIG. 7 shows a plan view of an inner stop contour of an aperture stop of the imaging optical unit according to FIG. 5.
Figure 8:
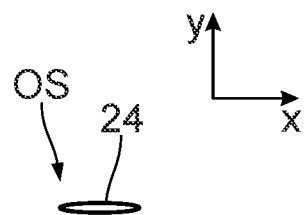
FIG. 8 shows a plan view of an outer stop contour of an obscuration stop of the imaging optical unit according to FIG. 5.

In the imaging light beam path between the mirrors M5 and M6, the projection optical unit 22 firstly has an obscuration stop OS and, closely adjacent thereto, an aperture stop AS. Locations, orientations, and marginal contour forms of the stops AS, OS emerge from tables 4a, 4b, and 6. An inner stop contour 23 of the aperture stop AS is illustrated in FIG. 7. An outer stop contour 24 of the obscuration stop OS is illustrated in FIG. 8.

Both stops AS, OS have an approximately elliptical form with a large x/y-aspect ratio, which is significantly greater than 5:1 in each case. The aperture stop AS has an extent of the inner stop contour 23 of 362 mm in the x-direction and an extent of the inner stop contour 23 of 40.5 mm in the y-direction. The obscuration stop OS has an extent of the outer stop contour 24 of 71.7 mm in the x-direction and of 8 mm in the y-direction.

The respective large x/y-aspect ratio of the stops AS, OS results from the different imaging scales of the projection optical unit 22 in the x- and y-direction. Further, this large x/y-aspect ratio is a consequence of the two second plane intermediate images 19 and 20.

In the projection optical unit 22, the first second plane intermediate image 19 lies between the mirrors M3 and M4 in the imaging light beam path.

In the projection optical unit 22, the image plane 9 extends virtually parallel to the object plane 5.

The two stops AS, OS do not lie on curved surfaces; i.e., they respectively lie in exactly one stop plane. The two stop or arrangement planes of the aperture stop AS on the one hand and of the obscuration stop OS on the other hand are spaced apart from one another. In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An imaging optical unit, comprising:
    a plurality of mirrors configured to guide imaging light from an object field in an object plane into an image field in an image plane along an imaging light beam path; and
    exactly one stop configured to define an entire outer marginal contour of a pupil of the imaging optical unit,
    wherein:
    the plurality of mirrors comprises first and second mirrors;
    the first mirror is configured so that, during use of the imaging optical unit, the imaging light is incident on the first mirror at an angle of incidence that is greater than 60°;
    the second mirror is configured so that, during use of the imaging optical unit, the imaging light is incident on the second mirror at an angle of incidence that is greater than 60°;
    in the imaging light beam path, the stop is in front of a penultimate mirror of the plurality of mirrors;
    the object field is spanned by a first Cartesian object field coordinate and a second Cartesian object field coordinate;
    a third Cartesian normal coordinate is perpendicular to both the first and second Cartesian object field coordinates;
    the imaging optical unit is configured so that, during use of the imaging optical unit:
        the imaging light extends in a first imaging light plane in which an imaging light main propagation direction lies; and
        the imaging light extends in a second imaging light plane in which the imaging light main propagation direction lies;
        the second imaging light plane is perpendicular to the first imaging light plane;
        a number of first plane intermediate images of the imaging light which extend in the first imaging light plane is different from a number of second plane intermediate images of imaging light which extend in the second imaging light plane.

2. The imaging optical unit of claim 1, wherein the plurality of mirrors comprises a last mirror in the imaging beam path which comprises an opening configured to pass imaging light during use of the imaging optical unit.

3. The imaging optical unit of claim 2, wherein the penultimate mirror in the imaging light beam path does not have an opening configured to pass imaging light during use of imaging optical unit.

4. The imaging optical unit of claim 3, wherein the stop is between the first and second mirrors.

5. The imaging optical unit of claim 4, wherein the plurality of mirrors comprises more than six mirrors, and the stop is between the fifth and sixth mirrors in the imaging light beam path.

6. The imaging optical unit of claim 5, wherein the stop has a 3D profile of a stop marginal contour.

7. The imaging optical unit of claim 6, wherein at least one of the intermediate images is between the first and second mirrors in the imaging light beam path.

8. The imaging optical unit of claim 7, wherein the plurality of mirrors comprises a mirror having an opening configured to pass imaging light during use of the imaging optical unit, and at least one of the intermediate images is arranged in a region of the opening.

9. The imaging optical unit of claim 8, wherein an entrance pupil of the imaging optical unit is upstream of the object field in the imaging light beam path.

10. The imaging optical unit of claim 9, wherein the pupil of the imaging optical unit has an obscuration, and provision is made of a stop for predefining at least one portion of an inner marginal contour of the obscuration of the pupil.

11. The imaging optical unit of claim 1, wherein the penultimate mirror in the imaging light beam path does not have an opening configured to pass imaging light during use of imaging optical unit.

12. The imaging optical unit of claim 1, wherein the stop is between the first and second mirrors.

13. The imaging optical unit of claim 1, wherein the plurality of mirrors comprises more than six mirrors, and the stop is between the fifth and sixth mirrors in the imaging light beam path.

14. The imaging optical unit of claim 1, wherein the stop has a 3D profile of a stop marginal contour.

15. The imaging optical unit of claim 1, wherein at least one of the intermediate images is between the first and second mirrors in the imaging light beam path.

16. The imaging optical unit of claim 1, wherein the plurality of mirrors comprises a mirror having an opening configured to pass imaging light during use of the imaging optical unit, and at least one of the intermediate images is arranged in a region of the opening.

17. The imaging optical unit of claim 1, wherein an entrance pupil of the imaging optical unit is upstream of the object field in the imaging light beam path.

18. The imaging optical unit of claim 1, wherein the pupil of the imaging optical unit has an obscuration, and provision is made of a stop for predefining at least one portion of an inner marginal contour of the obscuration of the pupil.

19. An optical system, comprising:
   an imaging optical unit according to claim 1; and
   an illumination optical unit configured to illuminate the object field with the imaging light.

20. An apparatus, comprising:
   an imaging optical unit according to claim 1;
   an illumination optical unit configured to illuminate the object field with the imaging light; and
   an EUV light source,
   wherein the apparatus is a projection exposure apparatus.

21. A method of using a projection exposure apparatus comprising an illumination optical unit and an imaging optical unit, the method comprising:
   using the illumination optical unit to illuminate a structure of a reticle; and
   using the imaging optical unit to project the illuminated structure of the reticle onto a light-sensitive material,
   wherein the imaging optical unit is an imaging optical unit according to claim 1.

* * * * *

UNITED STATES PATENT AND TRADEMARK OFFICE
CERTIFICATE OF CORRECTION

PATENT NO. : 10,254,653 B2
APPLICATION NO. : 15/967306
DATED : April 9, 2019
INVENTOR(S) : Hans-Juergen Rostalski Page 1 of 2

It is certified that error appears in the above-identified patent and that said Letters Patent is hereby corrected as shown below:

In the Specification

Column 8, Lines 34-42 (approx.), delete

" $$Z = \frac{c_x x^2 + c_y y^2}{1 + \sqrt{1 - (1 + k_x)(c_x x)^2 - (1 + k_y)(c_y y)^2}} +$$

$$C_1 x + C_2 y + C_3 x^2 + C_4 xy + C_5 y^2 + C_6 x^3 + \ldots +$$

$$C_9 y^3 + C_{10} x^4 + \ldots + C_{12} x^2 y^2 + \ldots C_{14} y^4 + C_{15} x^5 +$$

$$\ldots + C_{20} y^5 + C_{21} x^6 + \ldots + C_{24} x^3 y^3 + \ldots + C_{27} y^6 + \ldots$$ " and insert -- $$Z = \frac{c_x x^2 + c_y y^2}{1 + \sqrt{1 - (1 + k_x)(c_x x)^2 - (1 + k_y)(c_y y)^2}}$$

$$+ C_1 x + C_2 y$$
$$+ C_3 x^2 + C_4 xy + C_5 y^2$$
$$+ C_6 x^3 + \ldots + C_9 y^3$$
$$+ C_{10} x^4 + \ldots + C_{12} x^2 y^2 + \ldots + C_{14} y^4$$
$$+ C_{15} x^5 + \ldots + C_{20} y^5$$
$$+ C_{21} x^6 + \ldots + C_{24} x^3 y^3 + \ldots + C_{27} y^6$$
$$+ \ldots$$ --;

Column 22, Lines 1-7, delete "A pupil obscuration of the projection optical unit 7 is 15% of the numerical aperture of the projection optical unit 7. Hence, a surface portion of 0.152 of a pupil of the projection optical unit 7 is obscured. An object-image offset do's is approximately 2360 mm. The mirrors of the projection optical unit 7 can be accommodated in a parallelepiped having xyz-edge Signed and Sealed this
Nineteenth Day of May, 2020

Andrei Iancu
*Director of the United States Patent and Trademark Office* lengths of 797 mm×3048 mm×2115 mm." and insert the same on Column 21, Line 67, as a continuation of the same paragraph.